United States Patent
Kim et al.

(10) Patent No.: US 11,735,437 B2
(45) Date of Patent: Aug. 22, 2023

(54) APPARATUS AND METHOD FOR TREATING SUBSTRATE

(71) Applicant: SEMES CO., LTD., Cheonan-si (KR)

(72) Inventors: Boong Kim, Cheonan-si (KR); Oh Jin Kwon, Cheonan-si (KR); Sungho Jang, Cheonan-si (KR); Joo Jib Park, Anyang-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 92 days.

(21) Appl. No.: 17/132,008

(22) Filed: Dec. 23, 2020

(65) Prior Publication Data

US 2021/0111042 A1 Apr. 15, 2021

Related U.S. Application Data

(60) Continuation of application No. 15/834,512, filed on Dec. 7, 2017, now abandoned, which is a division of
(Continued)

(30) Foreign Application Priority Data

Jul. 29, 2011 (KR) .................. 10-2011-0076241
Dec. 22, 2011 (KR) .................. 10-2011-0140015

(51) Int. Cl.
*H01L 21/67* (2006.01)
*F26B 25/14* (2006.01)
(Continued)

(52) U.S. Cl.
CPC ........ *H01L 21/67028* (2013.01); *F26B 25/14* (2013.01); *H01L 21/6719* (2013.01);
(Continued)

(58) Field of Classification Search
CPC ............... F26B 25/14; H01L 21/67028; H01L 21/67034; H01L 21/67051;
(Continued)

(56) References Cited

U.S. PATENT DOCUMENTS 6,290,865 B1  9/2001  Lloyd et al.
6,712,081 B1  3/2004  Uehara et al.
(Continued)

FOREIGN PATENT DOCUMENTS

CN   101144678 A   3/2008
JP   2001-324263 A   11/2001
(Continued)

*Primary Examiner* — Jessica Yuen
(74) *Attorney, Agent, or Firm* — Harness, Dickey & Pierce, P.L.C.

(57) ABSTRACT

Provided are an apparatus and method for treating a substrate. Specifically, provided are an apparatus and method for treating a substrate through a supercritical process. The apparatus includes: a housing providing a space for performing a process; a support member disposed in the housing to support a substrate; a supply port configured to supply a process fluid to the housing; a shield member disposed between the supply port and the support member to prevent the process fluid from being directly injected to the substrate; and an exhaust port configured to discharge the process fluid from the housing.

20 Claims, 16 Drawing Sheets

Related U.S. Application Data application No. 13/559,851, filed on Jul. 27, 2012, now Pat. No. 9,984,902.

(51) Int. Cl.
*H01L 21/677* (2006.01)
*H01L 21/687* (2006.01)

(52) U.S. Cl.
CPC .. *H01L 21/67034* (2013.01); *H01L 21/67051* (2013.01); *H01L 21/67109* (2013.01); *H01L 21/67126* (2013.01); *H01L 21/67178* (2013.01); *H01L 21/67748* (2013.01); *H01L 21/6875* (2013.01)

(58) Field of Classification Search
CPC ......... H01L 21/67109; H01L 21/67126; H01L 21/67178; H01L 21/6719; H01L 21/67748; H01L 21/6875
See application file for complete search history.

(56) References Cited

U.S. PATENT DOCUMENTS

| | | |
|---|---|---|
| 2002/0160625 A1 | 10/2002 | Inoue et al. |
| 2002/0179114 A1 | 12/2002 | Sakashita et al. |
| 2003/0041968 A1 | 3/2003 | Saito et al. |
| 2003/0202792 A1 | 10/2003 | Goshi |
| 2004/0123484 A1 | 7/2004 | Yoshikawa et al. |
| 2007/0137679 A1 | 6/2007 | Rye et al. |
| 2008/0014358 A1 | 1/2008 | Koo et al. |
| 2008/0063493 A1 | 3/2008 | Cho et al. |
| 2009/0020068 A1 | 1/2009 | Ode |
| 2009/0071404 A1 | 3/2009 | Tada et al. |
| 2009/0107522 A1 | 4/2009 | Uchida et al. |
| 2012/0048304 A1* | 3/2012 | Kitajima ........... H01L 21/67034 134/30 |

FOREIGN PATENT DOCUMENTS

| | | |
|---|---|---|
| JP | 2002-320929 A | 11/2002 |
| JP | 2003-142368 A | 5/2003 |
| JP | 2004-146457 A | 5/2004 |
| JP | 2004-186530 A | 7/2004 |
| JP | 2006-169601 A | 6/2006 |
| JP | 2006-303316 A | 11/2006 |
| JP | 2007-305676 A | 11/2007 |
| JP | 2008-072118 A | 3/2008 |
| JP | 2008-306175 A | 12/2008 |
| JP | 2010-182817 A | 8/2010 |
| KR | 2004-0058207 A | 7/2004 |
| KR | 10-2007-0071916 A | 7/2007 |
| TW | 200425328 | 11/2004 |
| TW | 200717627 | 5/2007 |
| TW | 200805473 A | 1/2008 |
| TW | 200814182 A | 3/2008 |

* cited by examiner

APPARATUS AND METHOD FOR TREATING SUBSTRATE

CROSS-REFERENCE TO RELATED APPLICATIONS

This U.S. non-provisional patent application is a continuation of U.S. application Ser. No. 15/834,512, filed on Dec. 7, 2017, which is a divisional of U.S. application Ser. No. 13/559,851, filed on Jul. 27, 2012, which claims priority under 35 U.S.C. § 119 of Korean Patent Application Nos. 10-2011-0076241, filed on Jul. 29, 2011, and 10-2011-0140015, filed on Dec. 22, 2011, the entire contents of each of which are hereby incorporated by reference.

BACKGROUND OF THE INVENTION

The present invention disclosed herein relates to an apparatus and method for treating a substrate, and more particularly, to an apparatus and method for treating a substrate through a supercritical process.

Semiconductor devices are manufactured through various processes such as a photolithography process in which circuit patterns are formed on a substrate such as a silicon wafer. During such processes, various contaminants such as particles, organic contaminants, and metallic impurities are generated. Such contaminants cause defects on a substrate and thus affect semiconductor device performance and process yield. Therefore, cleaning processes are included in semiconductor device manufacturing processes to remove contaminants.

For example, cleaning processes include: a chemical process in which contaminants are removed from a substrate using a chemical; a washing process in which the chemical is washed using pure water; and a drying process in which the substrate is dried. In such a drying process, the pure water is replaced with an organic solvent such as isopropyl alcohol (IPA) having relatively low surface tension, and the organic solvent is evaporated.

However, although an organic solvent is used in a drying process, the drying process may cause pattern collapse in semiconductor devices having fine circuit patterns having line widths of 30 nm or smaller. Thus, instead of such a drying process, the use of a supercritical drying process increases.

SUMMARY OF THE INVENTION

The present invention is provided to dry a non-pattern side of a substrate as well as a patterned side of the substrate by using a supercritical fluid.

In addition, the present invention is provided to prevent substrate leaning in a supercritical process.

Features and aspects of the present invention are not limited to those mentioned above, and other features and aspects of the present invention will be apparently understood by those skilled in the art through the following description and accompanying drawings.

Embodiments of the present invention provide apparatuses for treating a substrate, the apparatus including: a housing providing a space for performing a process; a support member disposed in the housing to support a substrate; a supply port configured to supply a process fluid to the housing; a shield member disposed between the supply port and the support member to prevent the process fluid from being directly injected to the substrate; and an exhaust port configured to discharge the process fluid from the housing.

In some embodiments, the supply port may include a first supply port and a second supply port that are disposed at different surfaces of the housing, and the shield plate may be disposed between the support member and the first supply port.

In other embodiments, the first supply port may be disposed at a lower surface of the housing to inject the process fluid to a center region of a rear side of the substrate, and the second supply port may be disposed at an upper surface of the housing to inject the process fluid to a center region of a topside of the substrate.

In still other embodiments, the apparatus may further include a controller performing a control operation to supply the process fluid through the first supply port and then the second supply port.

In even other embodiments, the apparatus may further include a support extending from the lower surface of the housing, wherein the shield plate may be placed on the support.

In yet other embodiments, the shield plate may have a radius greater than that of the substrate.

In further embodiments, the process may be a supercritical process, and the process fluid may be in supercritical fluid phase.

In still further embodiments, the housing may include an upper housing and a lower housing disposed under the upper housing, wherein the apparatus may further include a lift member configured to lift one of the upper housing and the lower housing.

In even further embodiments, the support member may extend downward from the upper housing, and a lower end of the support member may be bent horizontally to support an edge region of the substrate.

In yet further embodiments, the apparatus may further include a horizontal positioning member to adjust a horizontal position of the upper housing.

In some embodiments, the first supply port may be disposed at the lower housing, and the second supply port may be disposed at the upper housing.

In other embodiments, the housing may have an opened side and include a door vertically movable for opening and closing the opened side.

In still other embodiments, the apparatus may further include a pressing member configured to apply a pressure to the door for closing the housing.

In other embodiments of the present invention, there are provided methods for treating a substrate, the methods including: carrying a substrate into a housing; placing the substrate on a support member; supplying a process fluid to the substrate; preventing the process fluid from being directly injected to the substrate; discharging the process fluid from the housing; and carrying the substrate out of the housing.

In some embodiments, the preventing of the process fluid may be performed using a shield plate disposed between the support member and a supply port through which the process fluid is supplied.

In other embodiments, the supplying of the process fluid port may be performed by injecting the process fluid toward a topside of the substrate through a first supply port disposed at an upper surface of the housing and injecting the process fluid toward a rear side of the substrate through a second supply port disposed at a lower surface of the housing, and the preventing of the process fluid may be performed using the shield plate disposed between the second support port and the support member so as to prevent the process fluid injected toward the rear side of the substrate from being directly injected to the substrate.

In still other embodiments, in the supplying of the process fluid, the process fluid may be injected through the second supply port, and if an inside pressure of the housing reaches a preset value, the process fluid may be started to be injected through the first supply port.

In even other embodiments, the process fluid may be a supercritical fluid, and the supercritical fluid may dissolve an organic solvent remaining on the substrate.

In yet other embodiments, the housing may include an upper housing and a lower housing disposed under the upper housing, the substrate may be placed on the support member in a state where the upper housing and the lower housing are spaced apart from each other, and after the substrate is carried into the housing, one of the upper housing and the lower housing may be lifted or lowered to close the housing.

In still other embodiments of the present invention, there are provided methods for treating a substrate, the methods including: carrying a substrate on which an organic solvent remains into a housing; creating a supercritical atmosphere in the housing by supplying a supercritical fluid toward a non-patterned side of the substrate while preventing the supercritical fluid from being directly injected to the substrate; and after the supercritical atmosphere is created, injecting the process fluid to a patterned side of the substrate to dissolve the organic solvent remaining between circuit patterns of the substrate and dry the substrate.

In some embodiments, the supercritical fluid may be prevented from being directly injected to the substrate by a shield member disposed on a path along which the supercritical fluid is injected toward the non-patterned side of the substrate.

In other embodiments, the supercritical fluid may be supercritical carbon dioxide.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

In the following description, terms and drawings are used for explaining embodiments of the present invention while not limiting the present invention.

Known techniques used in the present invention but not related to the concept of the present invention will not be explained in detail.

Hereinafter, a substrate treating apparatus 100 will be described according to exemplary embodiments of the present invention.

The substrate treating apparatus 100 may be used to perform a supercritical process for treating a substrate (S) using a supercritical fluid as a process fluid.

The term "substrate (S)" is used herein to denote any substrate used to manufacture a product such as a semiconductor device and a flat panel display (FPD) in which circuit patterns are formed on a thin film. Examples of substrates (S) include wafers such as silicon wafers, glass substrates, and organic substrates.

The term "supercritical fluid" means any substance having both the gas and liquid characteristics because the phase of the substance is in a supercritical state above its critical temperature and pressure. A supercritical fluid has molecular density close to that of liquid and viscosity close to that of gas, and is thus outstanding in diffusion ability, permeation ability, and dissolving other substances. Therefore, a supercritical fluid is advantageous in chemical reaction. In addition, a supercritical fluid has little surface tension, and thus applies little interfacial tension to microstructures.

Supercritical processes are performed using the properties of a supercritical fluid, and examples of supercritical processes include a supercritical drying process and a supercritical etch process. Hereinafter, a supercritical process will be explained based on a supercritical drying process. Although the following explanation is given based on a supercritical drying process for conciseness of explanation, the substrate treating apparatus 100 can be used for performing other supercritical processes.

A supercritical drying process may be performed to dissolve an organic solvent remaining on circuit patterns of a substrate (S) in a supercritical fluid and dry the substrate (S). In this case, satisfactory drying efficiency may be obtained while preventing pattern collapse. A substance miscible with an organic solvent may be used as a supercritical fluid in a supercritical drying process. For example, supercritical carbon dioxide ($scCO_2$) may be used as a supercritical fluid.

Figure 1:
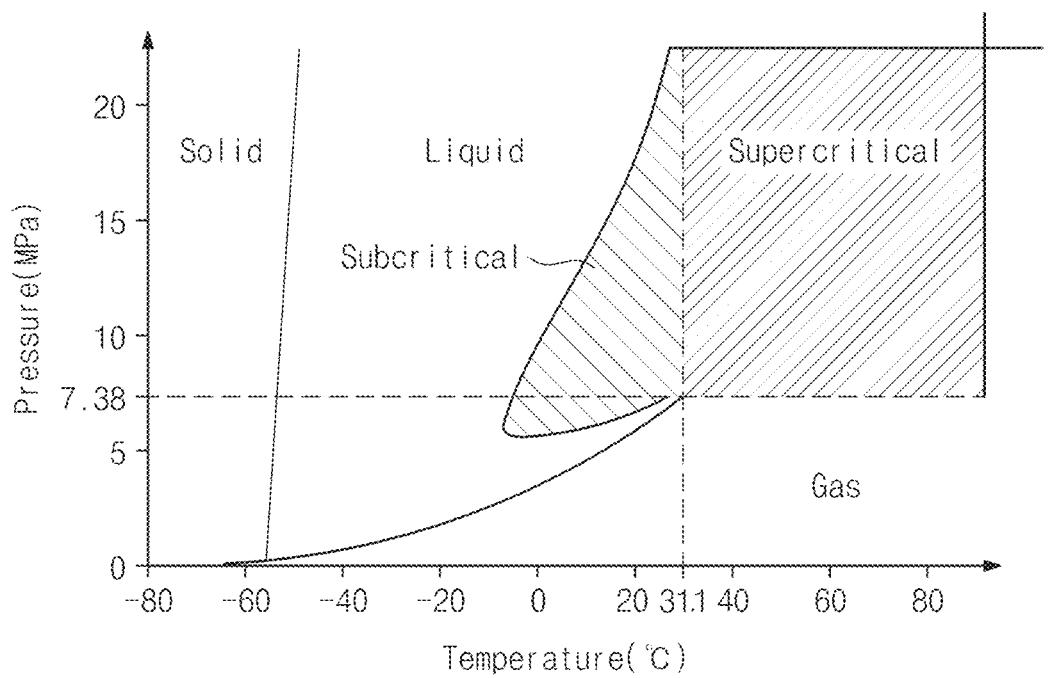
FIG. 1 is a phase diagram of carbon dioxide.

FIG. 1 is a phase diagram of carbon dioxide.

Since carbon dioxide has a relatively low critical temperature of 31.1° C. and critical pressure of 7.38 Mpa, it is easy to make carbon dioxide supercritical and control the phase of carbon dioxide by adjusting temperature and pressure. In addition, carbon dioxide is inexpensive. Furthermore, carbon dioxide is nontoxic, harmless, nonflammable, and inert, and has a diffusion coefficient about ten to hundred times the diffusion coefficient of water or other organic solvents to rapidly permeate and replace an organic solvent.

Furthermore, carbon dioxide has little surface tension. That is, the properties of carbon dioxide are suitable for drying a substrate (S) having fine patterns. In addition, carbon dioxide obtained from byproducts of various chemical reactions can be reused, and carbon dioxide used in a supercritical drying process can be separated from an organic solvent by vaporizing the carbon dioxide for reusing the carbon dioxide. That is, carbon dioxide is environmentally friendly.

Hereinafter, the substrate treating apparatus 100 will be described according to an embodiment of the present invention. The substrate treating apparatus 100 of the embodiment may be used to perform a cleaning process including a supercritical drying process.

Figure 2:
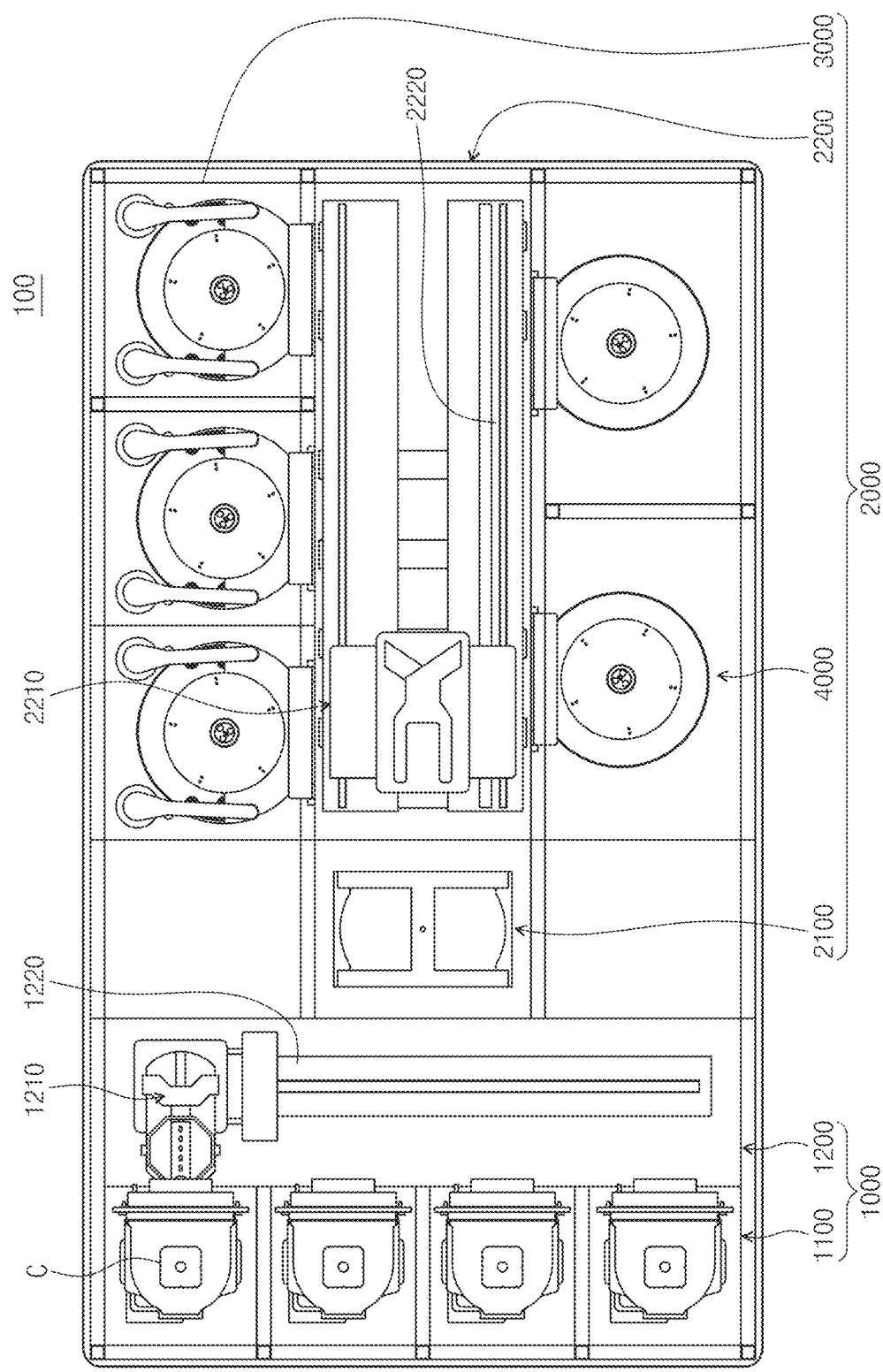
FIG. 2 is a plan view illustrating a substrate treating apparatus according to an embodiment of the present invention.

FIG. 2 is a plan view illustrating the substrate treating apparatus 100 according to an embodiment of the present invention.

Referring to FIG. 2, the substrate treating apparatus 100 includes an index module 1000 and a process module 2000.

The index module 1000 may receive substrates (S) from an external apparatus and carry the substrates (S) to the process module 2000, and the process module 2000 may perform a supercritical drying process.

The index module 1000 is an equipment front end module (EFEM) and includes load ports 1100 and a transfer frame 1200.

Containers (C) in which substrates (S) are stored are placed on the load ports 1100. Front opening unified pods (FOUPs) may be used as containers (C). Containers (C) may be carried to the load ports 1100 from an outside area or carried from the load ports 1100 to an outside area via an overhead transfer (OHT).

The transfer frame 1200 carries substrates (S) between the containers (C) placed on the load ports 1100 and the process module 2000. The transfer frame 1200 includes an index robot 1210 and an index rail 1220. The index robot 1210 may carry a substrate (S) while moving on the index rail 1220.

The process module 2000 is a module in which processes are actually performed. The process module 2000 includes a buffer chamber 2100, a transfer chamber 2200, a first process chamber 3000, and a second process chamber 4000.

A substrate (S) is temporarily stored in the buffer chamber 2100 while being carried between the index module 1000 and the process module 2000. A buffer slot may be formed in the buffer chamber 2100 to place a substrate (S) therein. For example, the index robot 1210 may pick up a substrate (S) from a container (C) and place the substrate (S) in the buffer slot, and a transfer robot 2210 of the transfer chamber 2200 may pick up the substrate (S) from the buffer slot and transfer the substrate (S) to the first process chamber 3000 or the second process chamber 4000. A plurality of buffer slots may be formed in the buffer chamber 2100 so that a plurality of substrates (S) can be placed in the buffer chamber 2100.

A substrate (S) is carried among the buffer chamber 2100, the first process chamber 3000, and the second process chamber 4000 through the transfer chamber 2200. The transfer chamber 2200 may include the transfer robot 2210 and a transfer rail 2220. The transfer robot 2210 may carry a substrate (S) while moving on the transfer rail 2220.

The first process chamber 3000 and the second process chamber 4000 may be used to perform a cleaning process. Procedures of a cleaning process may be sequentially performed in the first process chamber 3000 and the second process chamber 4000. For example, a chemical process, a rinsing process, and an organic solvent process of a cleaning process may be performed in the first process chamber 3000, and a supercritical drying process of the cleaning process may be performed in the second process chamber 4000.

The first process chamber 3000 and the second process chamber 4000 are disposed on sides of the transfer chamber 2200. For example, the first process chamber 3000 and the second process chamber 4000 may be disposed on opposite sides of the transfer chamber 2200 to face each other.

The process module 2000 may include a plurality of first process chambers 3000 and a plurality of second process chambers 4000. In this case, the first process chambers 3000 and the second process chambers 4000 may be arranged in lines along sides of the transfer chamber 2200 or may be vertically stacked at sides of the transfer chamber 2200. In addition, the first process chambers 3000 and the second process chambers 4000 may be arranged in a combination of the above-mentioned manners.

Arrangement of the first process chambers 3000 and the second process chambers 4000 is not limited to the above-mentioned manners. That is, the first process chambers 3000 and the second process chambers 4000 may be arranged in various manners in consideration of the footprint or processing efficiency of the substrate treating apparatus 100.

Hereinafter, the first process chamber 3000 will be described in detail.

Figure 3:
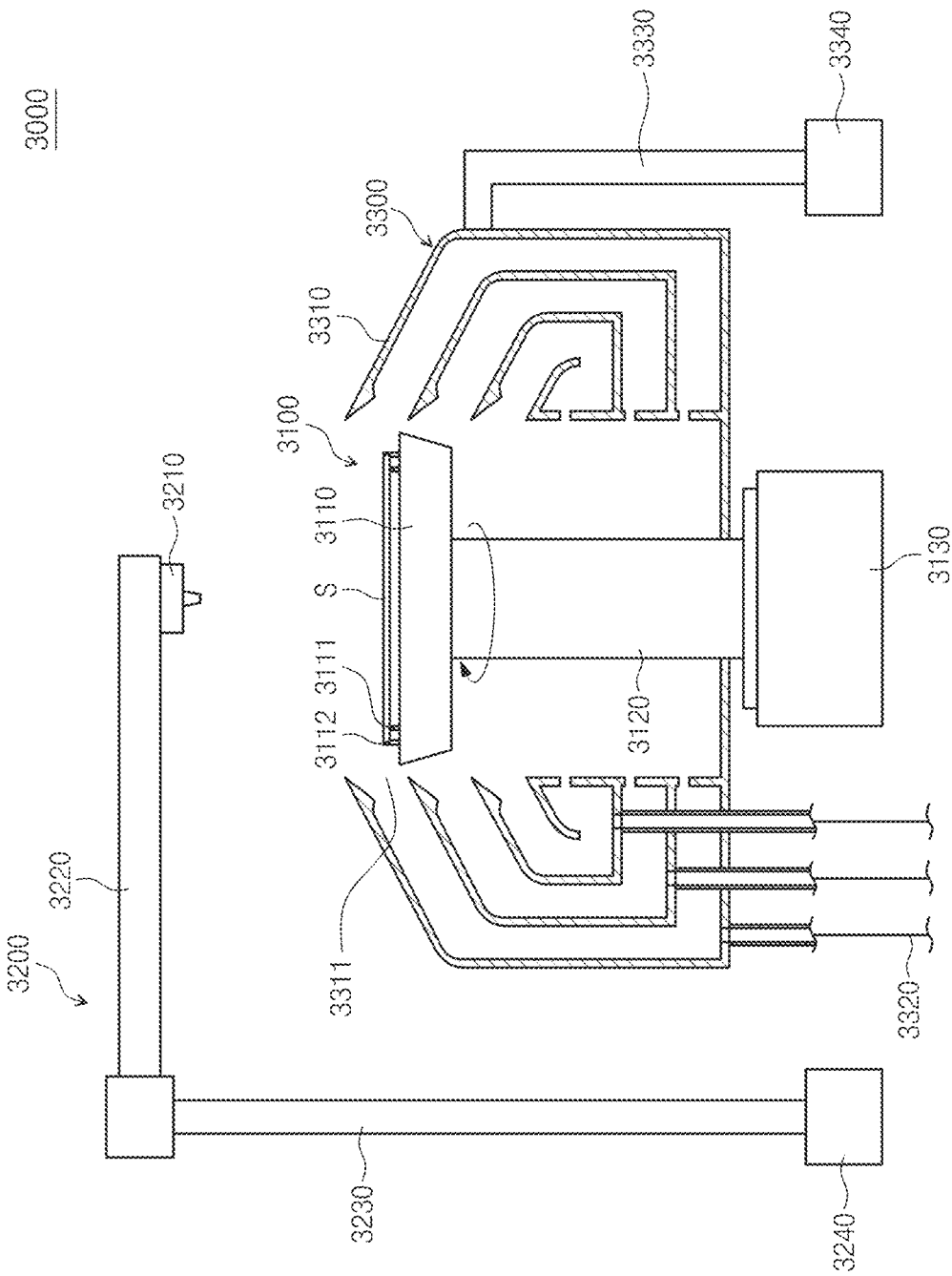
FIG. 3 is a sectional view illustrating a first process chamber depicted in FIG. 2, according to an embodiment of the present invention.

FIG. 3 is a sectional view illustrating the first process chamber 3000 depicted in FIG. 2.

The first process chamber 3000 may be used to perform a chemical process, a rinsing process, and an organic solvent process. Alternatively, the first process chamber 3000 may be used to perform some of such processes. The chemical process may be performed to remove contaminants from a substrate (S) by applying a detergent to the substrate (S), the rinsing process may be performed to remove the detergent remaining on the substrate (S) by applying a rinsing agent to the substrate (S), and the organic solvent process may be performed to replace the rinsing agent remaining between circuit patterns of the substrate (S) with an organic solvent having low surface tension.

Referring to FIG. 3, the first process chamber 3000 includes a support member 3100, a nozzle member 3200, and a collecting member 3300.

The support member 3100 may support a substrate (S) and rotate the substrate (S). The support member 3100 may include a support plate 3110, support pins 3111, chucking pins 3112, a rotation shaft 3120, and a rotary actuator 3130.

The support plate 3110 has a top surface shaped like a substrate (S), and the support pins 3111 and the chucking pins 3112 are provided on the top surface of the support plate 3110. The support pins 3111 may support a substrate (S), and the chucking pins 3112 may hold the substrate (S) firmly.

The rotation shaft 3120 is connected to the bottom side of the support plate 3110. The rotation shaft 3120 receives rotation power from the rotary actuator 3130 to rotate the support plate 3110. Thus, a substrate (S) placed on the support plate 3110 can be rotated. At this time, the chucking pins 3112 prevent the substrate (S) from departing from a set position.

The nozzle member 3200 injects a chemical to the substrate (S). The nozzle member 3200 includes a nozzle 3210, a nozzle bar 3220, a nozzle shaft 3230, and a nozzle shaft actuator 3240.

The nozzle 3210 is used to inject a chemical to the substrate (S) placed on the support plate 3110. The chemical may be a detergent, a rinsing agent, or an organic solvent. Examples of the detergent may include: a hydrogen peroxide ($H_2O_2$) solution; a solution prepared by mixing a hydrogen peroxide solution with ammonia ($NH_4OH$), hydrochloric acid (HCl), or sulfuric acid ($H_2SO_4$); and a hydrofluoric acid (HC) solution. The rinsing agent may be pure water. Examples of the organic solvent may include: isopropyl alcohol, ethyl glycol, 1-propanol, tetrahydrofuran, 4-hydroxy-4-methyl-2-pentanone, 1-butanol, 2-butanol, methanol, ethanol, n-propyl alcohol, and dimethyl ether. Such organic solvents may be used in the form of a solution or gas.

The nozzle 3210 is provided on a lower side of an end of the nozzle bar 3220. The nozzle bar 3220 is coupled to the nozzle shaft 3230, and the nozzle shaft 3230 can be lifted or rotated. The nozzle shaft actuator 3240 may lift or rotate the nozzle shaft 3230 to adjust the position of the nozzle 3210.

The collecting member 3300 collects a supplied chemical. If a chemical is supplied to the substrate (S) through the nozzle member 3200, the support member 3100 may rotate the substrate (S) so as to distribute the chemical uniformly to the entire area of the substrate (S). When the substrate (S) is rotated, the chemical may scatter from the substrate (S). The collecting member 3300 collects the chemical scattering from the substrate (S).

The collecting member 3300 may include a collecting vessel 3310, a collecting line 3320, a lift bar 3330, and a lift actuator 3340.

The collecting vessel 3310 has a ring shape surrounding the support plate 3110.

A plurality of collecting vessels 3310 may be provided. In this case, the collecting vessels 3310 may have ring shapes surrounding the support plate 3110 and sequentially spaced apart from the support plate 3110 when viewed from the topside. The more distant the collecting vessel 3310 is from the supporting plate 3110, the higher the collecting vessel 3310 is. Collecting slots 3311 are formed between the collecting vessels 3310 to receive a chemical scattering from the substrate (S).

The collecting line 3320 is formed on the bottom side of the collecting vessel 3310. A chemical collected in the collecting vessel 3310 is supplied to a chemical recycling system (not shown) through the collecting line 3320.

The lift bar 3330 is connected to the collecting vessel 3310 to receive power from the lift actuator 3340 and move the collecting vessel 3310 vertically. If a plurality of collecting vessels 3310 are provided, the lift bar 3330 may be connected to the outermost collecting vessel 3310. The lift actuator 3340 may lift or lower the collecting vessels 3310 using the lift bar 3330 so as to adjust the position of one of the collecting slots 3311 when a scattering chemical is collected through the one of the collecting slots 3311.

Hereinafter, the second process chamber 4000 will be described in detail.

The second process chamber 4000 may be used to perform a supercritical drying process using a supercritical fluid. As described above, the second process chamber 4000 may be used to perform other processes as well as the supercritical drying process.

Hereinafter, the second process chamber 4000 will be described in detail according to an embodiment of the present invention.

Figure 4:
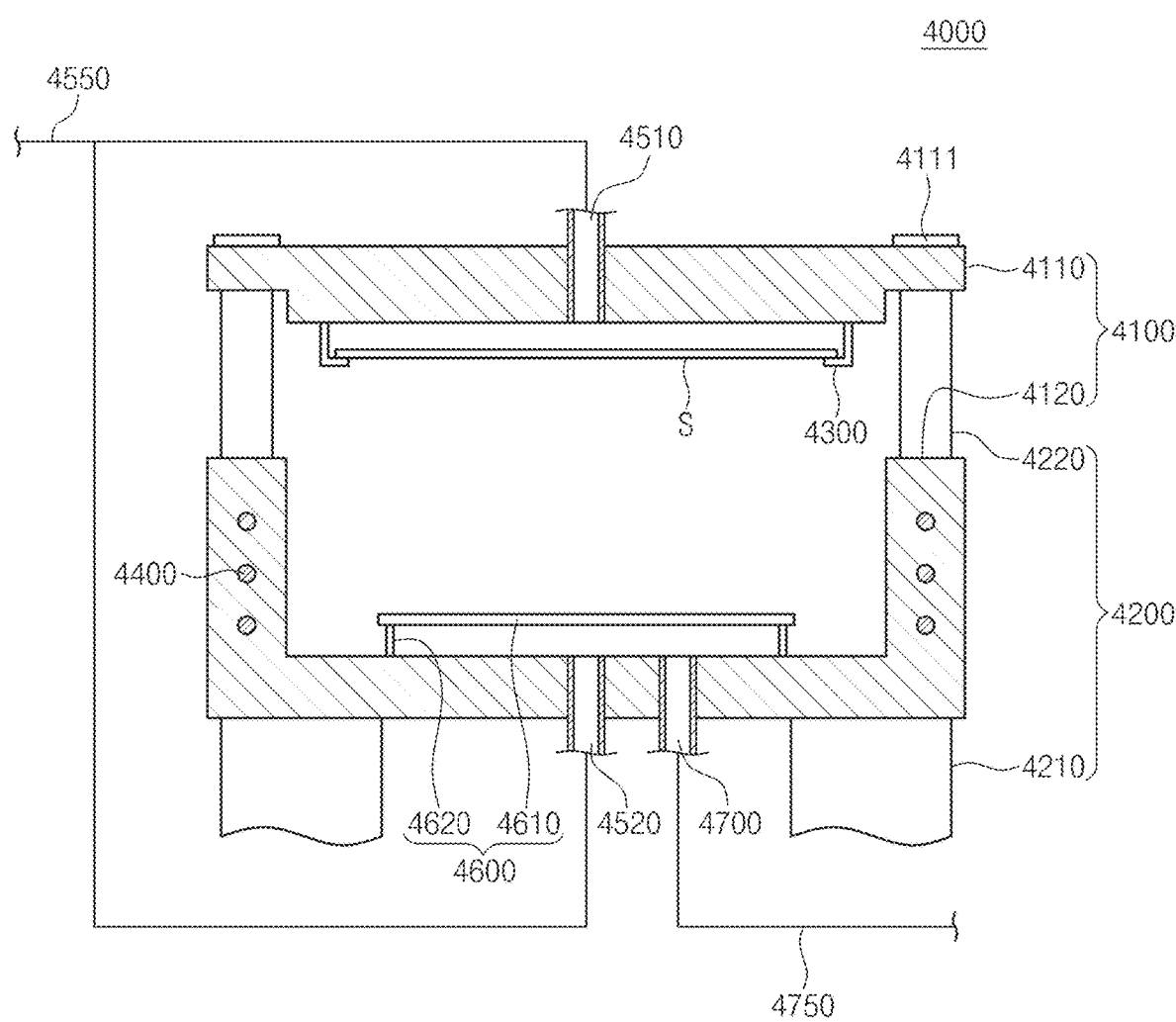
FIG. 4 is a sectional view illustrating a second process chamber depicted in FIG. 2, according to an embodiment of the present invention.

FIG. 4 is a sectional view illustrating the second process chamber 4000 depicted in FIG. 2.

Referring to FIG. 4, the second process chamber 4000 may include a housing 4100, a lift member 4200, a support member 4300, a heating member 4400, supply ports 4500, a shield member 4600, and an exhaust port 4700.

The housing 4100 provides a space in which a supercritical drying process can be performed. The housing 4100 is formed of a material resistant to high pressures equal to or higher than a critical pressure.

The housing 4100 may include an upper housing 4110 and a lower housing 4120 disposed under the upper housing 4110. That is, the housing 4100 may have upper and lower structures.

The upper housing 4110 may be fixed, and the lower housing 4120 may be vertically movable.

If the lower housing 4120 is moved down away from the upper housing 4110, the inside of the second process chamber 4000 is opened so that a substrate (S) can be carried into or out of the second process chamber 4000. A substrate (S) on which an organic solvent remains as a result of an organic solvent process performed in the first process chamber 3000 may be carried into the second process chamber 4000. If the lower housing 4120 is moved upward against the upper housing 4110, the inside of the second process chamber 4000 is closed, and then a supercritical drying process can be performed in the second process chamber 4000. Alternatively, the lower housing 4120 of the housing 4100 may be fixed, and the upper housing 4110 of the housing 4100 may be vertically movable.

The lift member 4200 is used to lift or lower the lower housing 4120. The lift member 4200 may include lift cylinders 4210 and lift rods 4220. The lift cylinders 4210 are coupled to the lower housing 4120 to apply vertical driving forces, that is, lifting/lowering forces to the lower housing 4120. During a supercritical drying process, the lift cylinders 4210 generate driving forces enough to push the lower housing 4120 against the upper housing 4110 for firmly closing the second process chamber 4000 although the inside pressure of the second process chamber 4000 is high at a value equal to or higher than a critical pressure. Ends of the lift rods 4220 are inserted in the lift cylinders 4210, and the other ends of the lift rods 4220 extending upward in a vertical direction from the ends are coupled to the upper housing 4110. In this structure, if the lift cylinders 4210 generate driving forces, the lift cylinders 4210 and the lift rods 4220 are relatively moved, and thus the lower housing 4120 coupled to the lift cylinders 4210 can be lifted or lowered. In addition, while the lower housing 4120 is lifted or lowered by the lift cylinders 4210, the lift rods 4220 guide the lower housing 4120 and prevent the upper housing 4110 and the lower housing 4120 from moving horizontally, and thus the upper housing 4110 and the lower housing 4120 do not depart from regular positions or paths.

The support member 4300 supports a substrate (S) at a position between the upper housing 4110 and the lower housing 4120. The support member 4300 may extend downward from the bottom side of the upper housing 4110 in a vertical direction, and a lower end of the support member 4300 may be bent in a horizontal direction. Thus, the support member 4300 may support an edge region of the substrate (S). Since the support member 4300 makes contact with only the edge region of the substrate (S) and supports the substrate (S), a supercritical drying process can be performed on the entire top surface of the substrate (S) and most of the bottom surface of the substrate (S). The top surface of the substrate (S) may be a patterned surface, and the bottom surface of the substrate (S) may be a non-patterned surface. In addition, since the support member 4300 is disposed on the fixed upper housing 4110, the support member 4300 can stably support the substrate (S) while the lower housing 4120 is lifted or lowered.

A horizontal positioning member 4111 may be disposed on the upper housing 4110 where the support member 4300 is provided. The horizontal positioning member 4111 is used to adjust the horizontal position of the upper housing 4110. The horizontal position of the substrate (S) placed on the support member 4300 of the upper housing 4110 can be adjusted by adjusting the horizontal position of the upper housing 4110. If the substrate (S) is inclined during a supercritical drying process, an organic solvent remaining on the substrate (S) may flow down, and thus a portion of the substrate (S) may not be dried or may be over-dried. The horizontal positioning member 4111 can prevent this by adjusting the horizontal position of the substrate (S). Alternatively, the horizontal positioning member 4111 may be disposed on the lower housing 4120 if the upper housing 4110 is lifted or lowered and the lower housing 4120 is fixed or if the support member 4300 is disposed on the lower housing 4120.

The heating member 4400 is used to heat the inside of the second process chamber 4000. The heating member 4400 may heat a supercritical fluid supplied into the second process chamber 4000 to a critical temperature or higher to maintain the supercritical fluid at a supercritical state or change the supercritical fluid into the supercritical state. The heating member 4400 may be buried in a wall of at least one of the upper housing 4110 and the lower housing 4120. For example, a heater configured to generate heat from electricity received from an external power source may be used as the heating member 4400.

The supply ports 4500 supply a supercritical fluid to the second process chamber 4000. The supply ports 4500 may be connected to a supply line 4550. A valve may be disposed at the supply ports 4500 to control the flow rate of a supercritical fluid supplied from the supply line 4550.

The supply ports 4500 include an upper supply port 4510 and a lower supply port 4520. The upper supply port 4510 is disposed at the upper housing 4110 to supply a supercritical fluid to the top surface of the substrate (S) placed on the support member 4300. The lower supply port 4520 is disposed at the lower housing 4120 to supply a supercritical fluid to the rear surface of the substrate (S) placed on the support member 4300.

The supply ports 4500 (the upper supply port 4510 and the lower supply port 4520) may supply a supercritical fluid to center regions of the substrate (S). For example, the upper supply port 4510 may be located above the substrate (S) supported on the support member 4300 and aligned with the center of the substrate (S). For example, the lower supply port 4520 may be located under the substrate (S) supported on the support member 4300 and aligned with the center of the substrate (S). Then, a supercritical fluid supplied through the supply port 4500 can be uniformly distributed to the entirety of the substrate (S) as the supercritical fluid reaches the center regions of the substrate (S) and spreads to the edge regions of the substrate (S).

A supercritical fluid may be supplied through the lower supply port 4520 and then the upper supply port 4510. In an early stage of a supercritical drying process, the inside pressure of the second process chamber 4000 may be lower than a critical pressure, and thus a supercritical fluid supplied into the second process chamber 4000 may be liquefied. Therefore, if a supercritical fluid is supplied through the upper supply port 4510 in an early stage of a supercritical drying process, the supercritical fluid may liquefy and fall to the substrate (S) by gravity to damage the substrate (S). A supercritical fluid may be supplied through the upper supply port 4510 after the supercritical fluid is supplied into the second process chamber 4000 through the lower supply port 4520 and the inside pressure of the second process chamber 4000 reaches a critical pressure, so as to prevent the supercritical fluid from liquefying and falling to the substrate (S).

The shield member 4600 prevents a supercritical fluid supplied through the supply ports 4500 from directly reaching the substrate (S). The shield member 4600 may include a shield plate 4610 and a support 4620.

The shield plate 4610 is disposed between one of the supply port 4500 and the substrate (S) supported on the support member 4300. For example, the shield plate 4610 may be disposed between the lower supply port 4520 and the support member 4300 under the substrate (S). In this case, the shield plate 4610 may prevent a supercritical fluid supplied through the lower supply port 4520 from directly reaching the bottom side of the substrate (S).

The radius of the shield plate 4610 may be similar to or greater than that of the substrate (S). Then, the shield plate 4610 may completely prevent a supercritical fluid from being directly injected to the substrate (S). Alternatively, the radius of the shield plate 4610 may be smaller than that of the substrate (S). In this case, the velocity of a supercritical fluid may be maximally reduced while preventing direct injection of the supercritical fluid to the substrate (S), and thus the supercritical fluid may stably reach the substrate (S) for an effective supercritical drying process.

The support 4620 supports the shield plate 4610. The shield plate 4610 may be placed on an end of the support 4620. The support 4620 may extend upward from the bottom surface of the housing 4100 in a direction perpendicular to the bottom surface of the housing 4100. The support 4620 and the shield plate 4610 may not be coupled to each other but the shield plate 4610 may simply be placed on the support 4620 and kept at the position by gravity. If the support 4620 and the shield plate 4610 are coupled using parts such as bolts and nuts, a supercritical fluid that can easily permeate into other substances may permeate between the parts to generate contaminants. Alternatively, the support 4620 and the shield plate 4610 may be provided in one piece.

If a supercritical fluid is supplied through the lower supply port 4520 in an early stage of a supercritical drying process, since the inside pressure of the housing 4100 is low, the supercritical fluid may rapidly be injected. If the high-speed supercritical fluid directly reach the substrate (S), a portion of the substrate (S) to which the supercritical fluid is directly injected may be bent (a leaning phenomenon). Furthermore, the substrate (S) may tremble due to the injection of the supercritical fluid, and thus an organic solvent remaining on the substrate (S) may flow to a circuit pattern of the substrate (S) to damage the circuit pattern.

Therefore, the shield plate 4610 is disposed between the lower supply port 4520 and the support member 4300 to prevent a supercritical fluid from being directly injected to the substrate (S) and thus prevent the substrate (S) from being damaged by a physical force applied by the supercritical fluid.

The position of the shield plate 4610 is not limited to the position between the lower supply port 4520 and the support member 4300.

Figure 5:
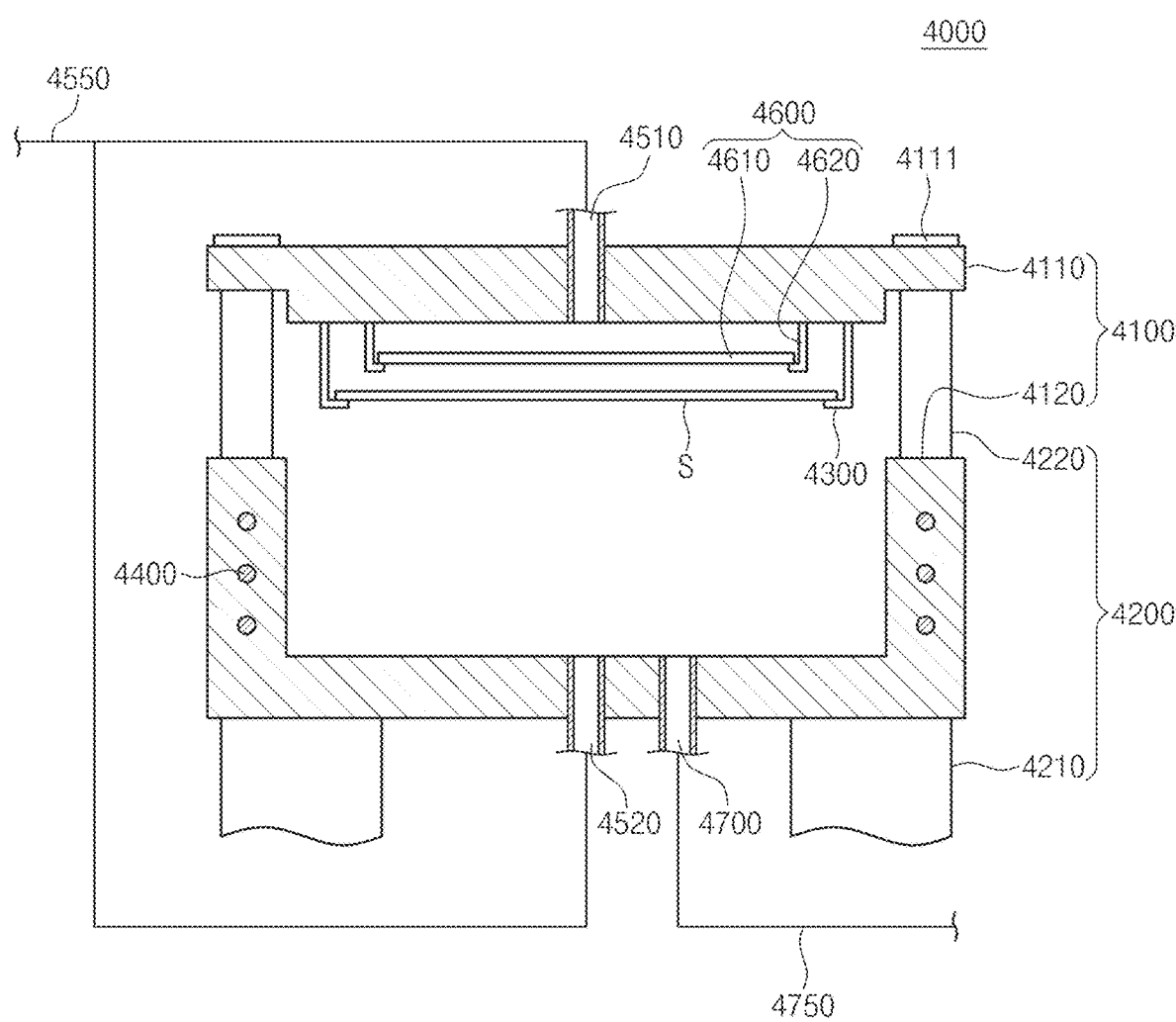
FIGS. 5 and 6 are views illustrating modification examples of the second process chamber depicted in FIG. 4.
Figure 6:
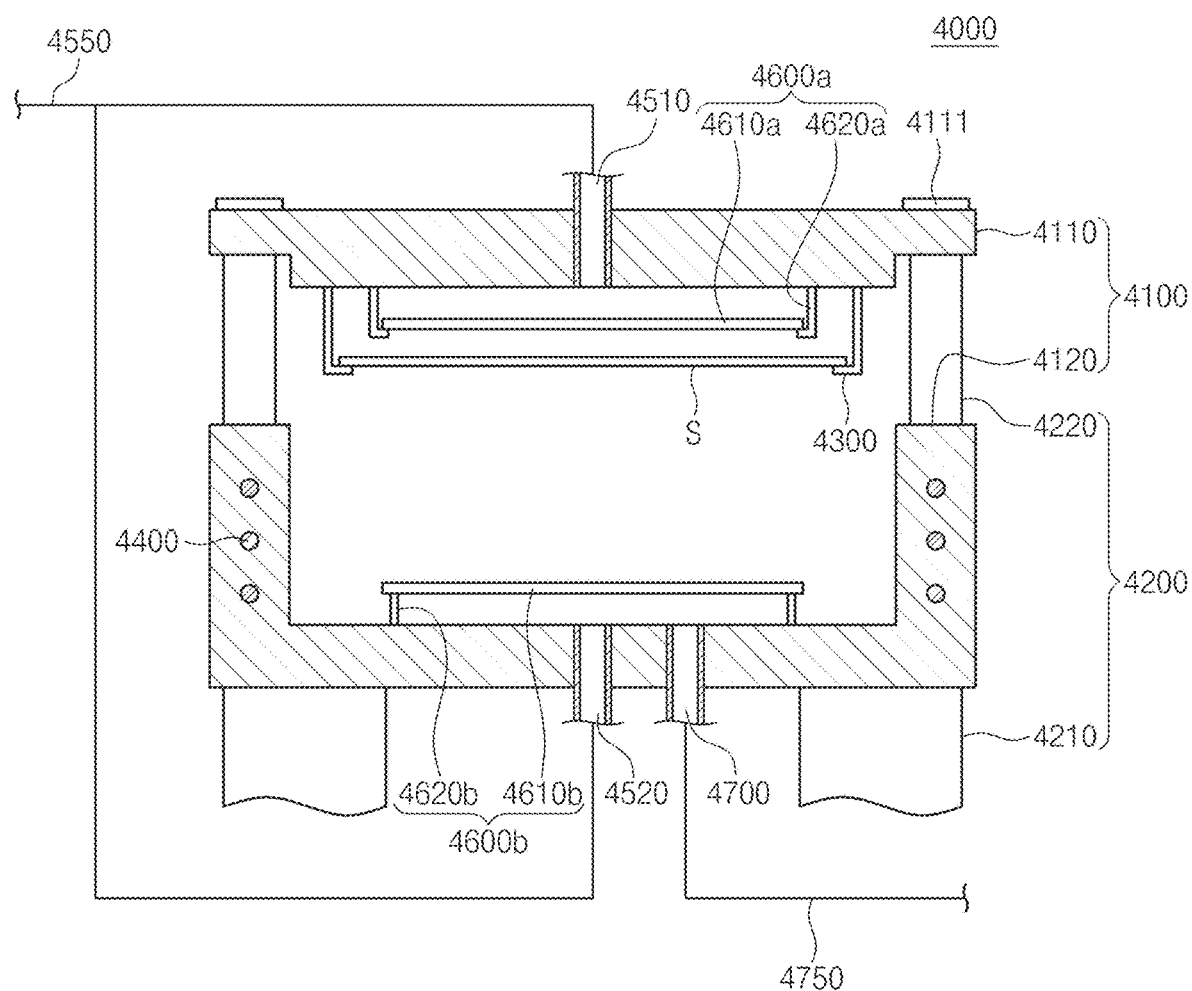

FIGS. 5 and 6 illustrate a modification example of the second process chamber 4000 shown in FIG. 4.

Referring to FIG. 5, a shield plate 4610 may be disposed between the upper supply port 4510 and a substrate (S) placed on the support member 4300. Referring to FIG. 6, a shield plate 4610a may be disposed between the upper supply port 4510 and the support member 4300, and a shield plate 4610b may be disposed between the lower supply port 4520 and the support member 4300. In the case where the shield plate 4610 (4610a) is disposed between the upper supply port 4510 and the support member 4300, a support 4620 may extend downward from the bottom side of the upper housing 4110 in a vertical direction, and the lower end of the support 4620 may be bent in a horizontal direction. Then, the shield plate 4610 may be supported on the support 4620 by gravity without any additional coupling part.

In this case, the shield plate 4610 may be placed in a path through which a supercritical fluid is supplied from one of the supply ports 4500 to the substrate (S), and thus the supercritical fluid may not be effectively supplied to the substrate (S). Therefore, the position of the shield plate 4610 may be determined by considering how much the substrate (S) is damaged by a supercritical fluid and how effectively the substrate (S) can be dried by the supercritical fluid.

Particularly, in the case where a plurality of supply ports 4500 are provided at the second process chamber 4000, a shield plate 4610 may be placed in a path through which a supercritical fluid is supplied from one of the supply ports 4500 directly to the substrate (S) in an early stage of a supercritical drying process.

The exhaust port 4700 discharges a supercritical fluid from the second process chamber 4000. The exhaust port 4700 may be connected to an exhaust line 4750 to discharge a supercritical fluid. A valve may be disposed at the exhaust port 4700 to control the flow rate of a supercritical fluid to be discharged through the exhaust line 4750. A supercritical fluid may be discharged to the atmosphere or a supercritical fluid recycling system (not shown).

The exhaust port 4700 may be formed in the lower housing 4120. In a late stage of a supercritical drying process, the inside pressure of the second process chamber 4000 may be reduced to a value lower than a critical pressure as a supercritical fluid is discharged from the second process chamber 4000, and thus a supercritical fluid filled in the second process chamber 4000 may be liquefied. The liquefied supercritical fluid may flow to the exhaust port 4700 of the lower housing 4120 by gravity and then flow to the outside through the exhaust port 4700.

Hereinafter, another embodiment of the second process chamber 4000 will be described according to another embodiment.

Figure 7:
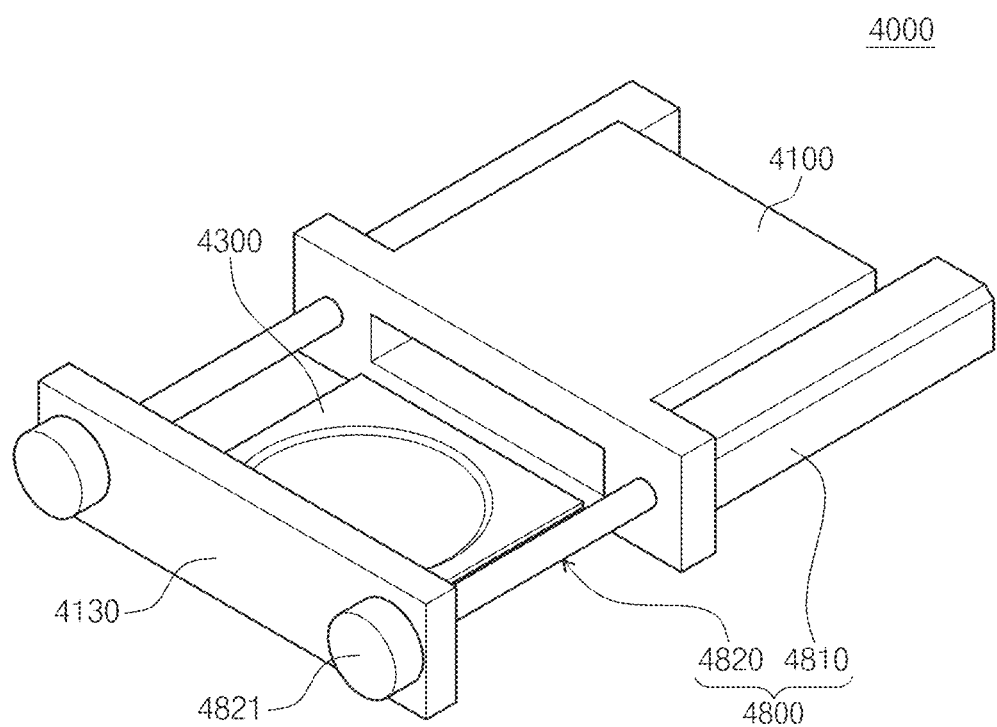
FIG. 7 is a perspective view illustrating another example of the second process chamber depicted in FIG. 2.
Figure 8:
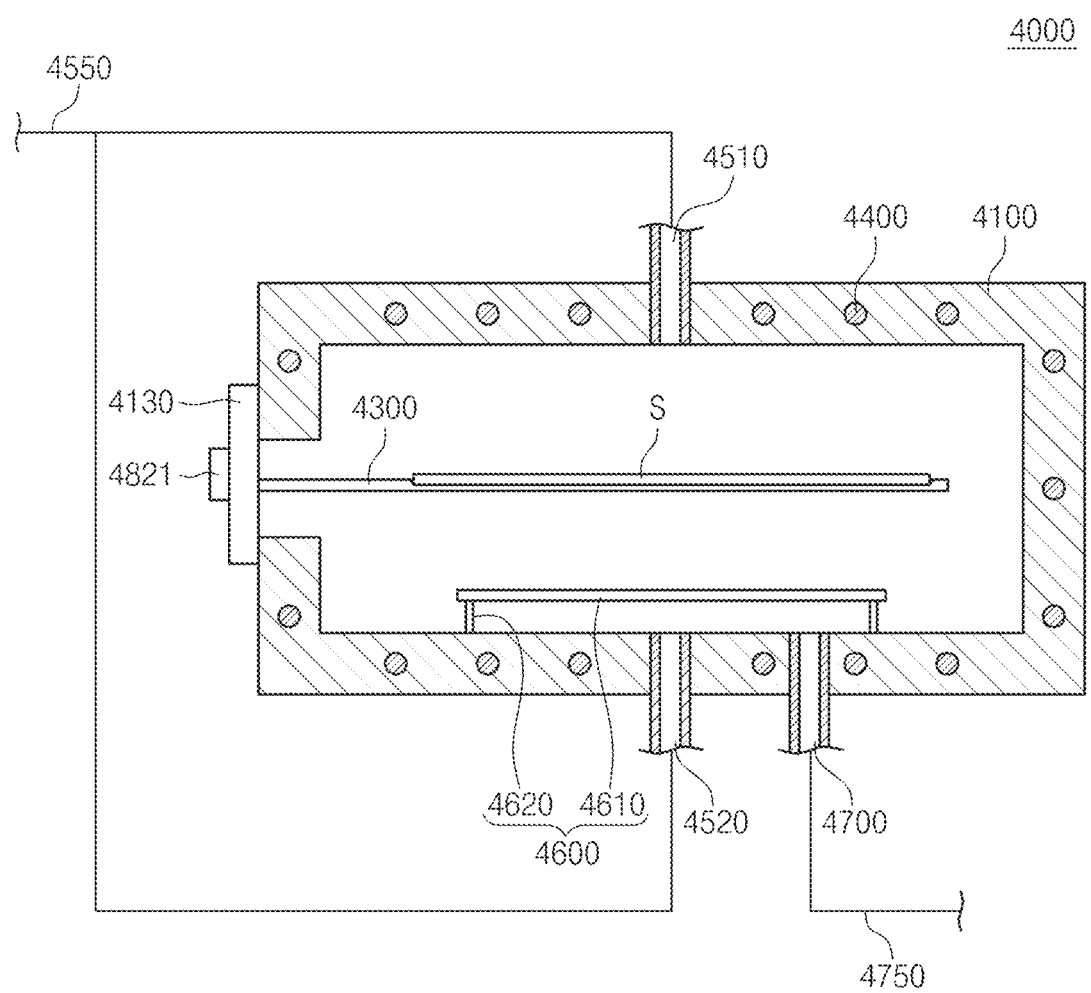
FIG. 8 is a sectional view illustrating the second process chamber depicted in FIG. 7.

FIG. 7 is a perspective view illustrating another example of the second process chamber 4000 shown in FIG. 2, and FIG. 8 is a sectional view illustrating the second process chamber 4000 of FIG. 7.

Referring to FIGS. 7 and 8, the second process chamber 4000 may include a housing 4100, a door 4130, pressing members 4800, a support member 4300, a heating member 4400, supply port 4500, a shield member 4600, and an exhaust port 4700.

Unlike the previous embodiment of the second process chamber 4000, the housing 4100 has a single structure. An opening may be formed in a side of the housing 4100. A substrate (S) may be carried into or out of the housing 4100 through the opening. The side of the housing 4100 in which the opening is formed may be perpendicular to a side of the transfer chamber 2200 along which the second process chamber 4000 is disposed.

The door 4130 faces the opening. The door 4130 may be moved close to or away from the opening in a horizontal direction so as to close or open the housing 4100.

The support member 4300 may be disposed on the door 4130. A surface of the door 4130 on which the support member 4300 is disposed may face the opening. The support member 4300 disposed on the door 4130 may be slid into or out of the housing 4100 through the opening as the door 4130 is moved. A side of the support member 4300 may be fixed to the surface of the door 4130 facing the opening, and the support member 4300 may extend horizontal from the surface of the door 4130 in a plate shape.

The support member 4300 may support an edge region of a substrate (S). For example, a recess having a shape similar to or equal to the shape of a substrate (S) may be formed in the plate-shaped support member 4300, and a hole may be formed in the recess. A substrate (S) may be placed on the recess, and the top and rear surface of the substrate (S) may be exposed owing to the hole formed in the recess. Thus, the entirety of the substrate (S) can be dried during a supercritical drying process.

The opening formed in a side of the housing 4100 may have the same shape as the side shape of the support member 4300 or may be slightly greater than the side of the housing 4100. Since the inside of the housing 4100 is kept at a high pressure equal to or greater than a critical pressure during a supercritical drying process, a force necessary to close the housing 4100 with the door 4130 is proportional to the size of the opening. Thus, the size of the opening may be adjusted to side area of the support member 4300 to reduce a force necessary to close the housing 4100.

The pressing members 4800 moves the door 4130 to close or opening the housing 4100. The pressing members 4800 may include pressing cylinders 4810 and pressing rods 4820.

The pressing cylinders 4810 may be disposed at both sides of the housing 4100. The pressing rods 4820 may be inserted in both sides of the opening of the housing 4100, and ends of the pressing rods 4820 may be coupled to the door 4130. For example, the ends of the pressing rods 4820 may be inserted through the door 4130, and rod heads 4821 may be provided on the ends of the door 4130 at a side of the door 4130 opposite to the opening of the housing 4100.

In this structure, the pressing rods 4820 may be horizontally moved by the pressing cylinders 4810 to move the door 4130 horizontally. If the door 4130 is moved away from the opening and the support member 4300 is exposed to the outside of the housing 4100, the transfer robot 2210 can place a substrate (S) on the support member 4300. Then, the door 4130 may be moved so as to close the opening and place the substrate (S) placed on the support member 4300 in the housing 4100.

In addition, during a supercritical drying process, the pressing cylinders 4810 generate forces to keep the door 4130 in tight contact with the opening against the inside pressure of the housing 4100 tending to open the door 4130. The forces generated by the pressing cylinders 4810 are applied to the door 4130 through the rod heads 4821 of the pressing rods 4820 provided on the side of the door 4130 opposite to the opening so that the housing 4100 can be kept close during the supercritical drying process.

Since the heating member 4400, the supply ports 4500, the shield member 4600, and the exhaust port 4700 are identical or similar to those of the second process chamber 4000 of the previous embodiment, detailed descriptions thereof will not be repeated.

Hereinafter, another embodiment of the second process chamber 4000 will be described.

Figure 9:
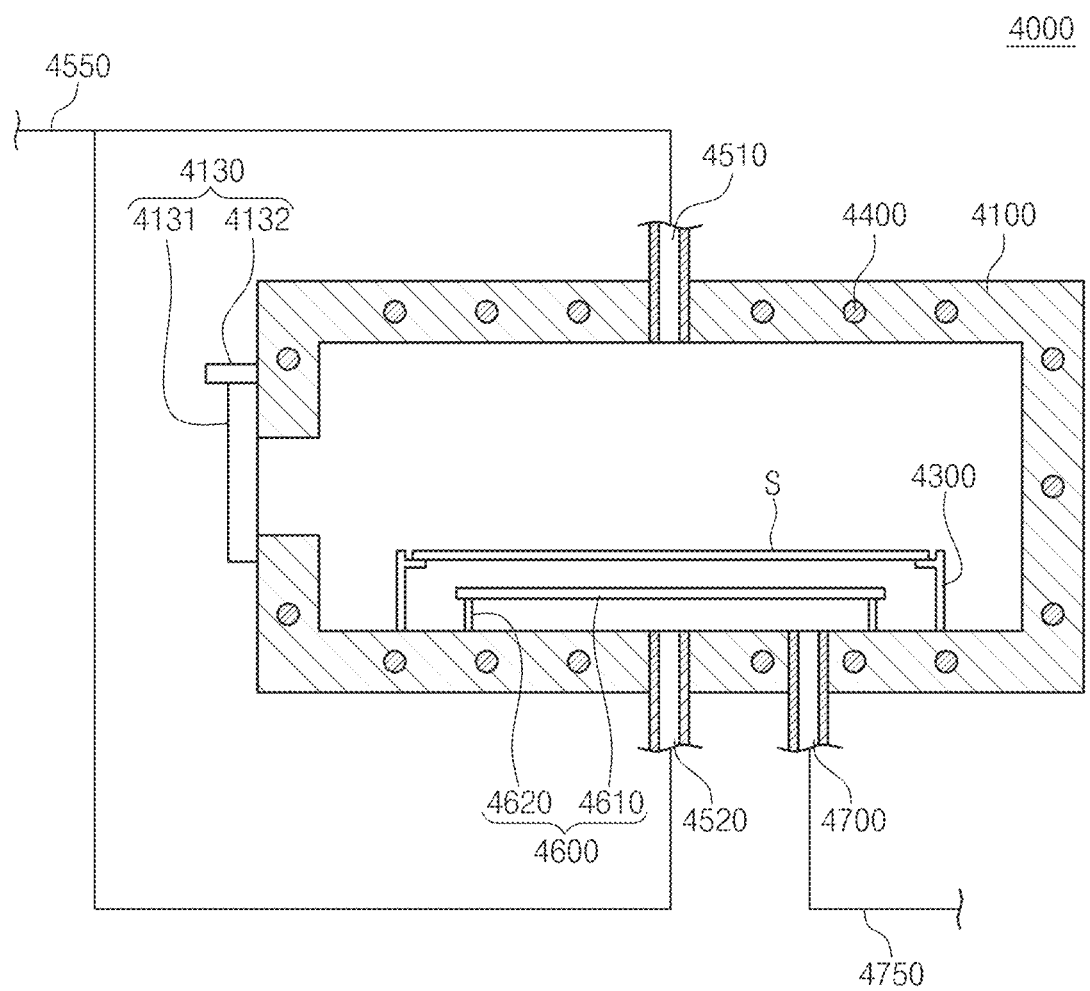
FIG. 9 is a sectional view illustrating another example of the second process chamber depicted in FIG. 2.

FIG. 9 is a sectional view illustrating another embodiment of the second process chamber 4000.

Referring to FIG. 9, the second process chamber 4000 may include a housing 4100, a door 4130, a support member 4300, a heating member 4400, supply ports 4500, a shield member 4600, and an exhaust port 4700.

Like the housing 4100 of the previous embodiment, the housing 4100 has a single structure having an opening at a side thereof. The door 4130 is configured to be vertically moved to open or close the opening of the housing 4100. The door 4130 may include a door plate 4131 and a door driving unit 4132, and the door driving unit 4132 may vertically move the door plate 4131 to open or close the opening.

The support member 4300 extends upward from a lower side of the housing 4100 in a direction perpendicular to the lower side, and the upper end or upper end portion of the support member 4300 may be horizontally bent. A substrate (S) may be placed on the support member 4300, and a supercritical fluid may be supplied to the top and bottom sides of the substrate (S) placed on the support member 4300.

Embodiments of the second process chamber 4000 have been described, and a plurality of such second process chambers 4000 may be provided in the substrate treating apparatus 100 in a stacked manner.

Figure 10:
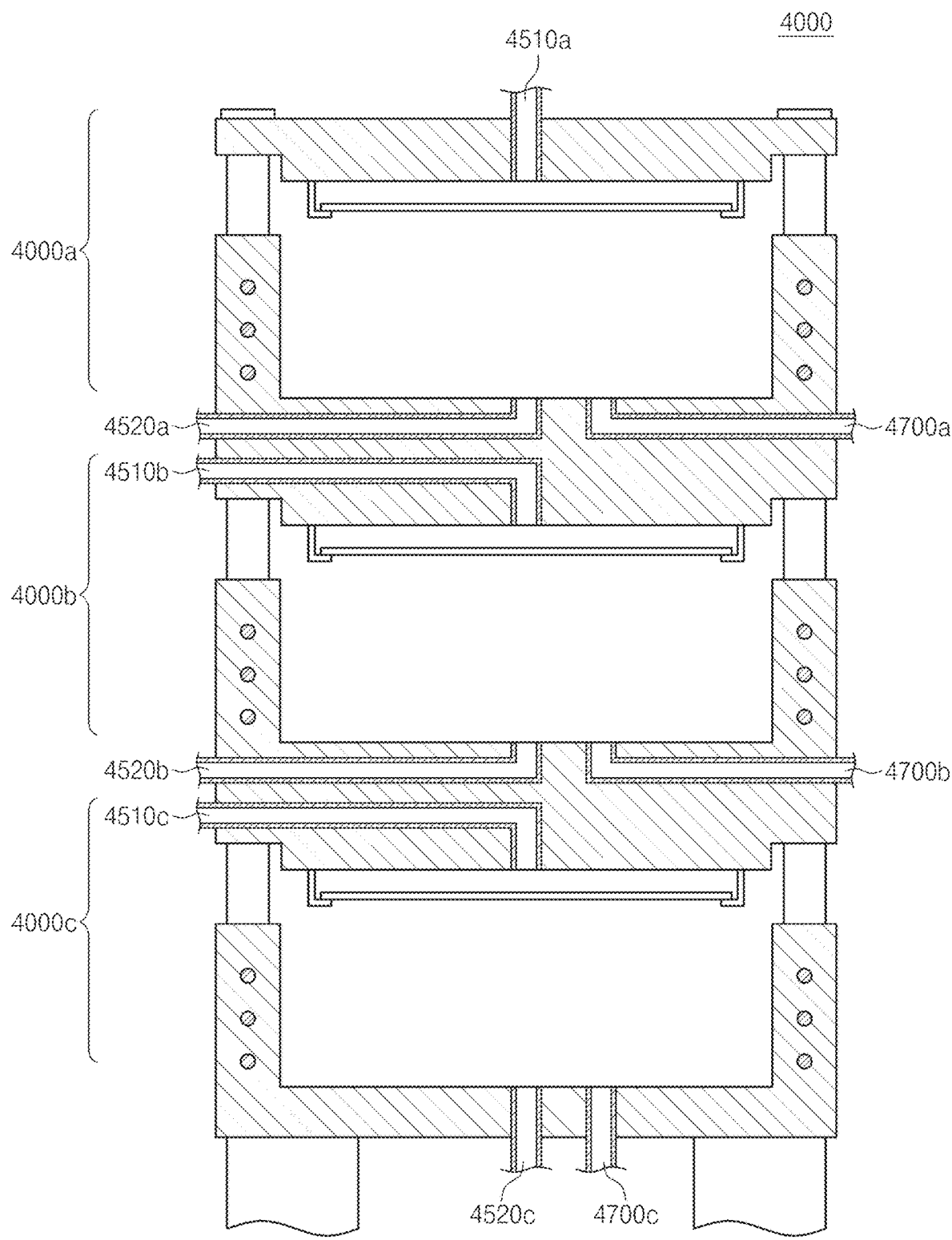
FIG. 10 is a view in which such second process chambers as depicted in FIG. 4 are stacked.

FIG. 10 illustrates a stacked state of second process chambers 4000*a*, 4000*b*, and 4000*c* such as the second process chamber 4000 shown in FIG. 4.

Referring to FIG. 10, three second process chambers 4000*a*, 4000*b*, and 4000*c* are vertically stacked. The number of the second process chambers 4000*a*, 4000*b*, and 4000*c* may be varied.

A lower housing 4120 of the uppermost second process chamber 4000*a* and an upper housing 4110 of the middle second process chamber 4000*b* may be formed in one piece, and a lower housing 4120 of the middle second process chamber 4000*b* and an upper housing 4110 of the lowermost second process chamber 4000*c* may be formed in one piece.

In this case, supply ports 4500 and exhaust ports 4700 formed in housings 4100 except for an upper housing 4110 of the uppermost second process chamber 4000*a* and a lower housing 4120 of the lowermost second process chamber 4000*c* may be connected respectively to a supply line 4550 and an exhaust line 4750 through sides of the housings 4100. The supply line 4550 and the exhaust line 4750 may be formed of an elastic and flexible material.

Lift rods 4220 of a lift member 4200 may be inserted through the second process chambers 4000*a*, 4000*b*, and 4000*c*, and ends of the lift rods 4220 may be coupled to the uppermost second process chamber 4000*a*. Lift cylinders 4210 may lift or lower the lift rods 4220 to open or close the second process chambers 4000*a*, 4000*b*, and 4000*c* sequentially from the lower or upper side.

While the present invention has been explained for the case where substrate treating apparatus 100 treats a substrate (S) using a supercritical fluid, the substrate treating apparatus 100 of the present invention is not limited to performing a supercritical drying process. For example, the substrate treating apparatus 100 may be used to treat a substrate (S) by supplying a different process fluid into the second process chamber 4000 through the supply ports 4500 instead of supplying a supercritical fluid. For example, organic solvents, gases having various ingredients, plasma gases, or inert gases may be used instead of a supercritical fluid.

In addition, the substrate treating apparatus 100 may further include a controller for controlling elements of the substrate treating apparatus 100. For example, the controller may control the heating member 4400 to adjust the inside temperature of the housing 4100. In another example, the controller may control valves disposed at the nozzle member 3200, the supply line 4550, and the exhaust line 4750 to adjust the flow rates of a chemical or supercritical fluid. In another example, the controller may control the lift member 4200 or the pressing member 4800 to open or close the housing 4100. In another example, under the control of the controller, a supercritical fluid may be supplied through one of the upper supply port 4510 and the lower supply port 4520, and if the inside pressure of the second process chamber 4000 reaches a preset value, the supercritical fluid may be supplied through the other of the upper supply port 4510 and the lower supply port 4520.

The controller may be hardware, software, or a device such as computer provided as a combination of hardware and software.

For example, the controller may be hardware such as ASICs (application specific integrated circuits), DSPs (digital signal processors), DSPDs (digital signal processing devices), PLDs (programmable logic devices), FPGAs (field programmable gate arrays), processors, micro-controllers, microprocessors, and electric devices having similar control functions.

For example, the controller may be software such as a software code or application written in at least one programming language. Software may be executed by a controller provided in the form of hardware. Alternatively, software may be transmitted from an external device such as a server to a controller provided in the formed of hardware and may be installed on the controller.

Hereinafter, a substrate treating method will be explained using the substrate treating apparatus 100 according to an embodiment of the present invention. Although the substrate treating method is explained using the substrate treating apparatus 100 in the following description, the substrate treating method may be performed using another apparatus similar to the substrate treating apparatus 100. In addition, the substrate treating method of the present invention may be stored in a computer-readable recording medium in the form of an executable code or program.

Hereinafter, an embodiment of the substrate treating method of the present invention will be explained. The embodiment relates to the a cleaning process in general.

Figure 11:
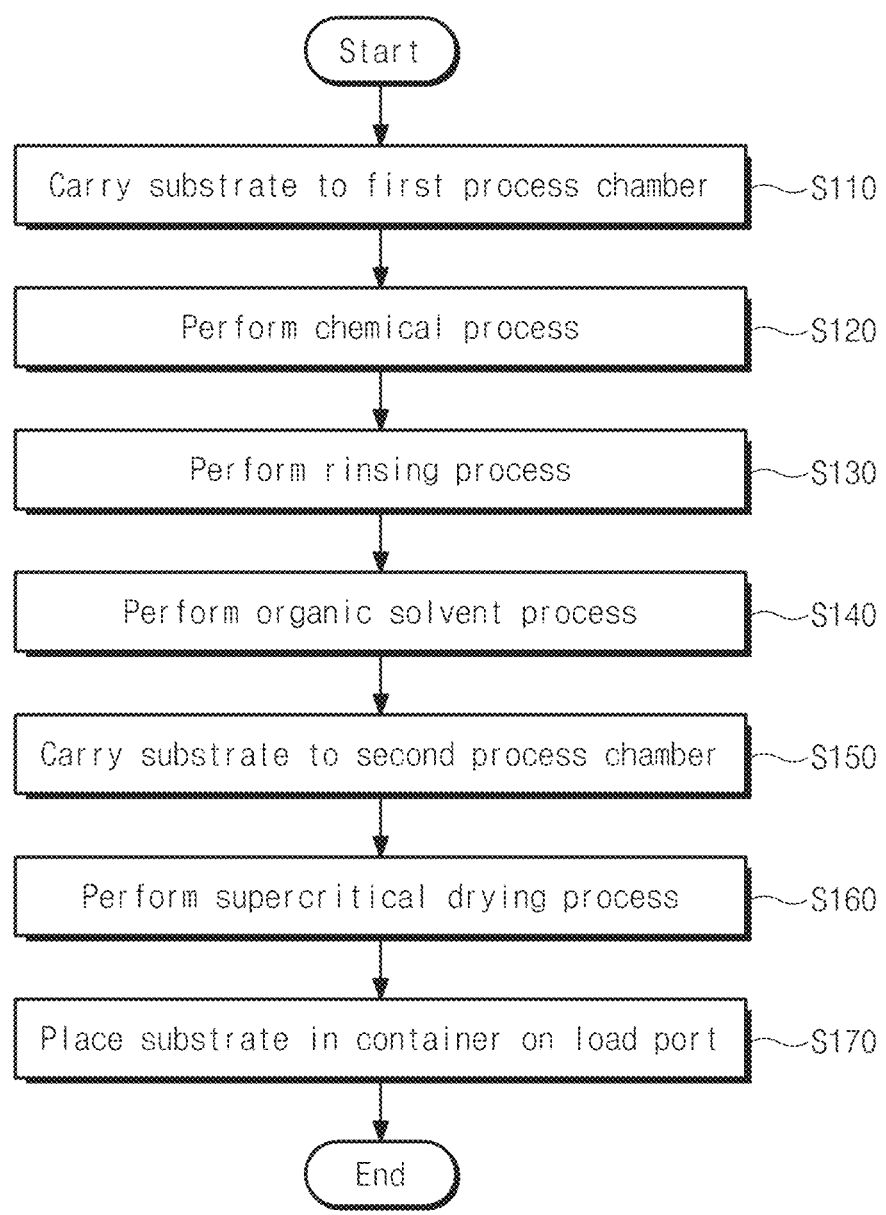
FIG. 11 is a flowchart for explaining a substrate treating method according to an embodiment of the present invention.

FIG. 11 is a flowchart for explaining a substrate treating method according to an embodiment.

The substrate treating method of the current embodiment includes: operation S110 in which a substrate (S) is carried into the first process chamber 3000; operation S120 in which a chemical process is performed; operation S130 in which a rinsing process is performed; operation S140 in which an organic solvent process is performed; operation S150 in which the substrate (S) is carried to a second process chamber 4000; operation S160 in which a supercritical drying process is performed; and operation S170 in which the substrate (S) is put in a container (C) placed in a load port 1100. The above-listed operations are not required to be performed in the listed order. For example, an operation listed later may be performed prior to an operation listed first. This is equal in another embodiment of the substrate treating method. The operations will now be explained in detail.

A substrate (S) is carried into the first process chamber 3000 (S110). First, a container in which substrates (S) are stored is placed on the load port 1100 by a carrying device such as an OHT. Then, the index robot 1210 picks up a substrate (S) from the container and places the substrate (S) in a buffer slot. The transfer robot 2210 picks up the substrate (S) from the buffer slot and carries the substrate (S) into the first process chamber 3000. The substrate (S) is placed on the support plate 3110 in the first process chamber 3000.

Thereafter, a chemical process is performed (S120). After the substrate (S) is placed on the support plate 3110, the nozzle shaft 3230 is moved and rotated by the nozzle shaft actuator 3240 to place the nozzle 3210 directly above the substrate (S). A detergent is injected to the top side of the substrate (S) through the nozzle 3210. Contaminants are removed from the substrate (S) as the detergent is injected. At this time, the rotary actuator 3130 rotates the rotation shaft 3120 to rotate the substrate (S). As the substrate (S) is rotated, the detergent can be uniformly supplied to the substrate (S) although the detergent scatters from the substrate (S). The detergent scattering from the substrate (S) is collected in the collecting vessels 3310 where the detergent is discharged to a fluid recycling system (not shown). At this time, the lift actuator 3340 lifts or lowers the collecting vessels 3310 so that the scattering detergent can be collected in one of the collecting vessels 3310.

After contaminants are removed from the substrate (S), a rinsing process is performed (S130). After the chemical process performed to remove contaminants from the substrate (S), the detergent remains on the substrate (S). The nozzle 3210 through which the detergent is injected is moved away from the topside of the substrate (S), and another nozzle 3210 is moved to a position directly above the substrate (S) to inject a rinsing agent to the topside of the substrate (S). The rinsing agent supplied to the substrate (S) cleans the detergent remaining on the substrate (S). During the rinsing process, the substrate (S) may be rotated, and a chemical may be collected. The lift actuator 3340 adjusts the height of the collecting vessels 3310 so that the rinsing agent can be collected in one of the collecting vessels 3310 different from that used to collect the detergent.

After the substrate (S) is sufficiently washed, an organic solvent process is performed (S140). After the rinsing process, another nozzle 3210 is moved to a position directly above the substrate (S) to inject an organic solvent to the substrate (S). The rinsing agent remaining on the substrate (S) is replaced with the organic solvent. In the organic solvent process, the substrate (S) may not be rotated or may be rotated at low speed. The reason for this is that if the organic solvent evaporates soon, the surface tension of the organic solvent may cause interfacial tension between circuit patterns of the substrate (S) to make the circuit patterns collapse.

After the organic solvent process in the first process chamber 3000, the substrate (S) is carried to the inside of the second process chamber 4000 (S150), and a supercritical drying process is performed in the second process chamber 4000. The operations S150 and S160 will be explained later in more detail when another embodiment of the substrate treating method is explained.

After the supercritical drying process, the substrate (S) is carried into the container placed on the load port 1100 (S170). The second process chamber 4000 is opened, and the transfer robot 2210 picks up the substrate (S). The substrate (S) may be carried to the buffer chamber 2100 by the transfer robot 2210, and the index robot 1210 may carry the substrate (S) from the buffer chamber 2100 to the container (C).

Hereinafter, another embodiment of the substrate treating method of the present invention will be explained. The other embodiment of the substrate treating method relates to a supercritical drying process in the second process chamber 4000.

Figure 12:
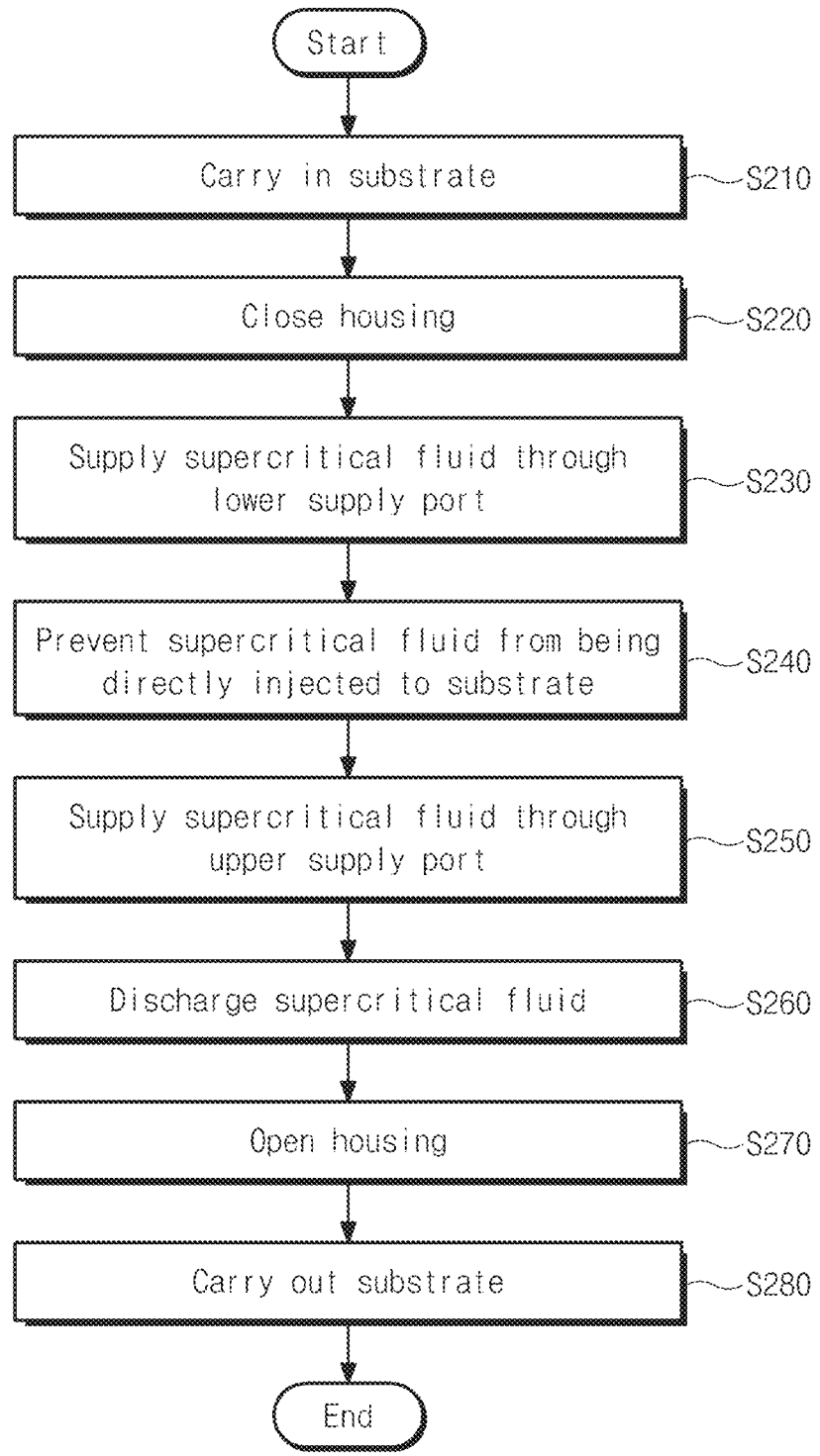
FIG. 12 is a flowchart for explaining another embodiment of the substrate treating method.

FIG. 12 is a flowchart for explaining another embodiment of the substrate treating method.

The substrate treating method of the other embodiment includes: operation S210 in which a substrate (S) is carried into the second process chamber 4000; operation S220 in which the housing 4100 is closed; operation S230 in which a supercritical fluid is supplied to the lower supply port 4520; operation S240 in which the supercritical fluid is prevented from being directly injected to the substrate (S); operation S250 in which the supercritical fluid is supplied to the upper supply port 4510; operation S260 in which the supercritical fluid is discharged; operation S270 in which the housing 4100 is opened; and operation S280 in which the substrate (S) is carried out of the second process chamber 4000. The operations will now be explained in detail.

FIGS. 13 through 16 are views for explaining the substrate treating method of FIG. 12.

A substrate (S) is carried into the second process chamber 4000 (S210). The transfer robot 2210 places the substrate (S) on the support member 4300 of the second process chamber 4000. The transfer robot 2210 may pick up the substrate (S) from the first process chamber 3000 in a state where an organic solvent remains on the substrate (S), and may place the substrate (S) on the support member 4300.

Figure 13:
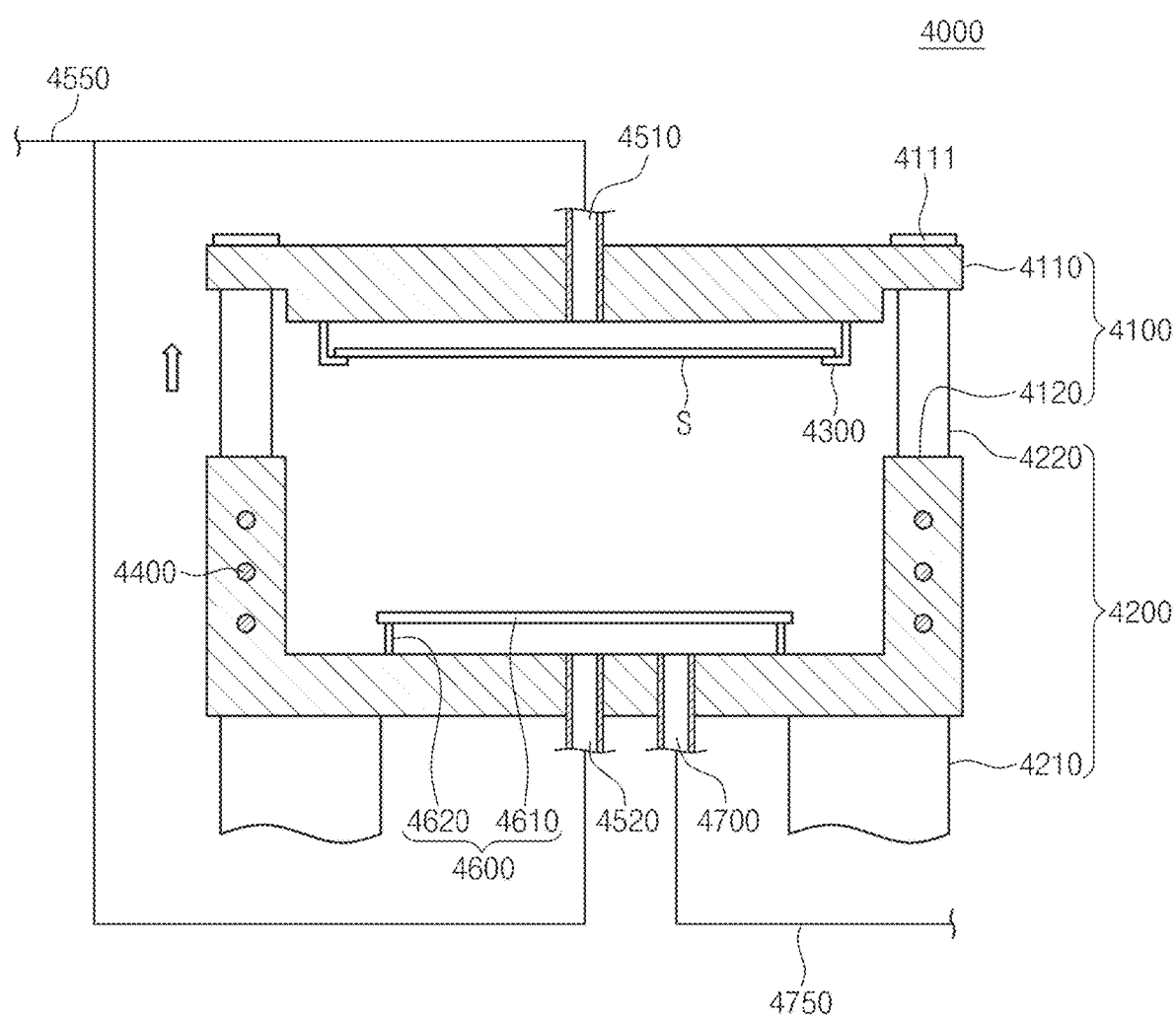
FIGS. 13 through 16 are views for explaining operations of the substrate treating method.

Referring to FIG. 13, in the case where the second process chamber 4000 has the upper and lower structures (the upper housing 4110 and the lower housing 4120), the transfer robot 2210 places the substrate (S) on the support member 4300 in a state where the upper housing 4110 and the lower housing 4120 are separated and opened.

In the case where the second process chamber 4000 has the slide structure with the horizontally slidable door 4130, the transfer robot 2210 places the substrate (S) on the support member 4300 in a state where the door 4130 is moved away from an opening. After the substrate (S) is placed, the door 4130 may be moved to the housing 4100 to place the substrate (S) in the second process chamber 4000.

In the case where the second process chamber 4000 has the structure in which the door plate 4131 is moved by the door driving unit 4132, the transfer robot 2210 may move into the housing 4100 to place the substrate (S) on the support member 4300.

After the substrate (S) is carried in the housing 4100, the housing 4100 is closed (S220).

Figure 14:
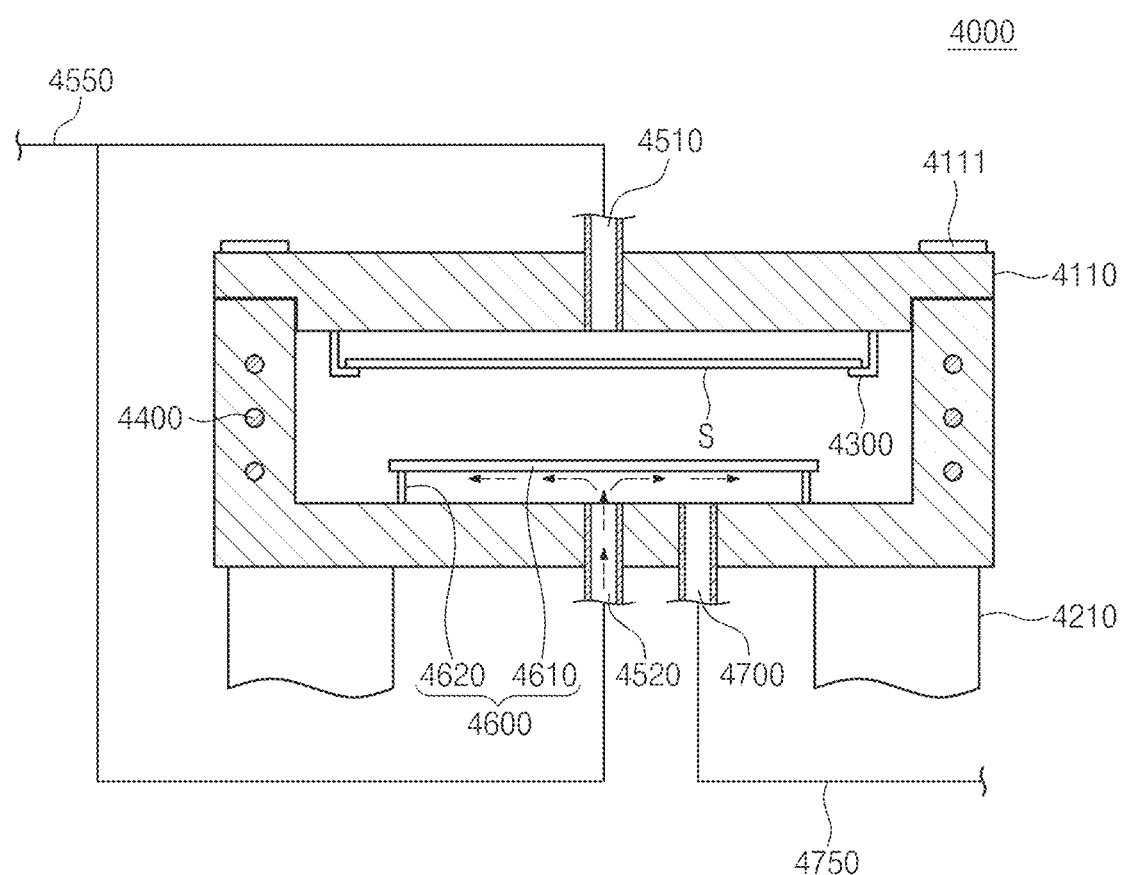

Referring to FIG. 14, in the case where the second process chamber 4000 has the upper and lower structures, the lift member 4200 lifts the lower housing 4120 against the upper housing 4110 to close the housing 4100 (that is, to close the second process chamber 4000).

In the case where the second process chamber 4000 has the slide structure, the pressing member 4800 horizontally moves the door 4130 against the opening to close the housing 4100. Otherwise, the door driving unit 4132 moves the door plate 4131 to close the opening.

After the second process chamber 4000 is closed, a supercritical fluid is supplied to the lower supply port 4520 (S230). When the supercritical fluid is initially supplied, the inside pressure of the housing 4100 may be lower than a critical pressure, and thus the supercritical fluid may liquefy. If the supercritical fluid is supplied to a position above the topside of the substrate (S), the supercritical fluid may liquefy and fall to the topside of the substrate (S) by gravity to damage the substrate (S). Therefore, the supercritical fluid may first be supplied through the lower supply port 4520 and then through the upper supply port 4510. At this time, the inside of the housing 4100 may be heated by the support member 4300.

The supercritical fluid is prevented from being directly injected to the substrate (S) (S240). Referring again to FIG. 14, the shield plate 4610 disposed between the lower supply port 4520 and the support member 4300 may prevent the supercritical fluid supplied through the lower supply port 4520 from being directly injected to the substrate (S). Thus, a physical force may not be applied to the substrate (S) by the supercritical fluid to prevent leaning of the substrate (S). The supercritical fluid injected through the lower supply port 4520 in a vertically upward direction may collide with the shield plate 4610 and then flow horizontally to the substrate (S).

Figure 15:
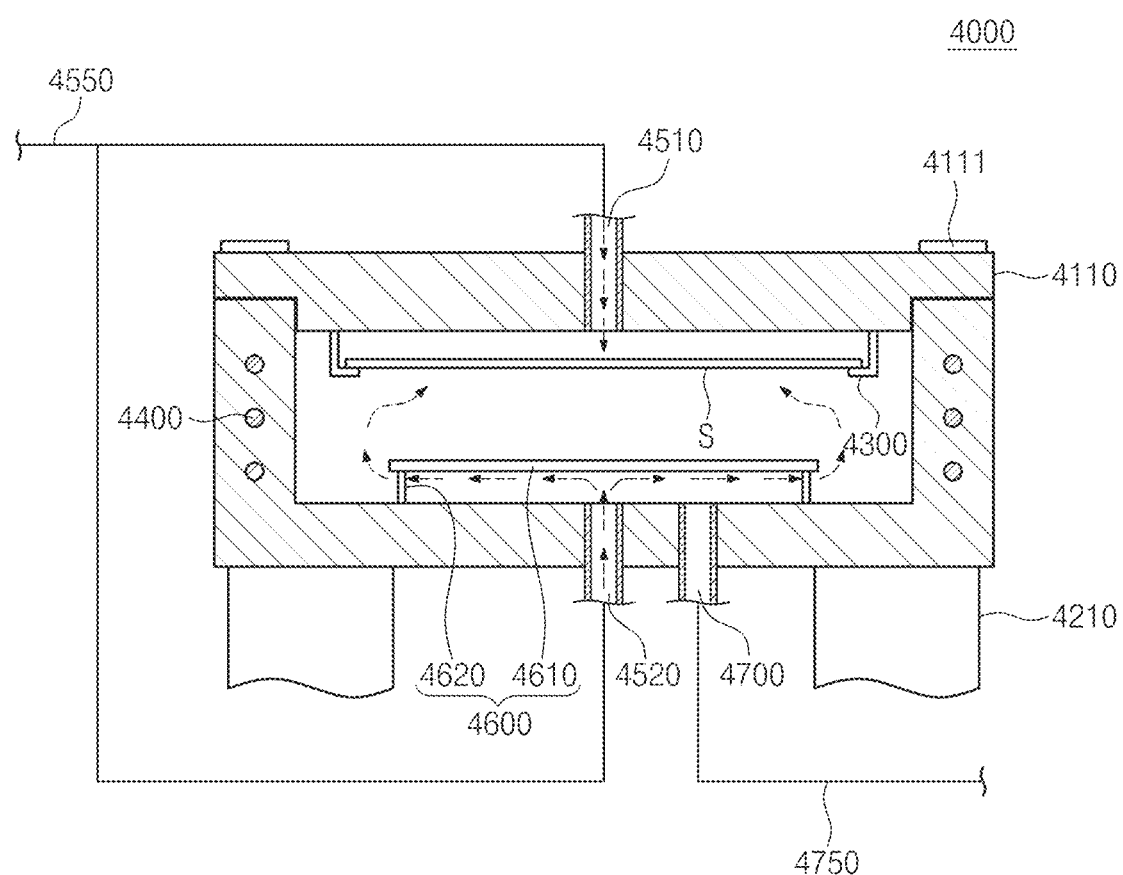

Referring to FIG. 15, the supercritical fluid is supplied to the upper supply port 4510 (S250). If the supercritical fluid is continuously supplied through the upper supply port 4510, the inside pressure of the housing 4100 becomes equal to or greater than a critical pressure, and if the inside of the housing 4100 is heated by the heating member 4400, the inside temperature of the housing 4100 becomes equal to or greater than a critical temperature. Thus, the inside of the housing 4100 can be in a supercritical state. When the inside of the housing 4100 enter a supercritical state, the supercritical fluid may be supplied through the upper supply port 4510. That is, under the control of the controller, the supercritical fluid may be supplied through the upper supply port 4510 when the inside pressure of the housing 4100 becomes equal to or greater than a critical pressure.

At this time, the supercritical fluid supplied through the upper supply port 4510 may not blocked by a shield plate 4610. The reason for this is that since the inside pressure of the housing 4100 is greater than a critical pressure, the velocity of the supercritical fluid supplied through the upper supply port 4510 is largely reduced in the housing 4100. Thus, when the supercritical fluid reaches the substrate (S), the velocity of the supercritical fluid is too low to cause leaning of the substrate (S).

Since the supercritical fluid supplied through the upper supply port 4510 is not blocked by a shield plate 4610, the topside of the substrate (S) may be efficiently dried by the supercritical fluid. Since the topside of the substrate (S) is a patterned surface in general, no shield plate 4610 may be disposed between the upper supply port 4510 and the support member 4300 so as to effectively supply the supercritical fluid to the topside of the substrate (S) for removing an organic solvent remaining between circuit patterns of the topside of the substrate (S). Alternatively, according to process conditions, a shield plate 4610 may be disposed between the upper supply port 4510 and the support member 4300 to prevent the supercritical fluid from being directly injected to the topside of the substrate (S).

If the substrate (S) is sufficiently dried as the organic solvent remaining on the substrate (S) is dissolved in the supercritical fluid, the supercritical fluid is discharged (S260). The supercritical fluid is discharged from the second process chamber 4000 through the exhaust ports 4700. Supply and discharge of the supercritical fluid may be controlled by adjusting the flow rates of the supercritical fluid in the supply line 4550 and the exhaust line 4750 by using the controller. The supercritical fluid may be discharged to the atmosphere or a supercritical fluid recycling system (not shown).

Figure 16:
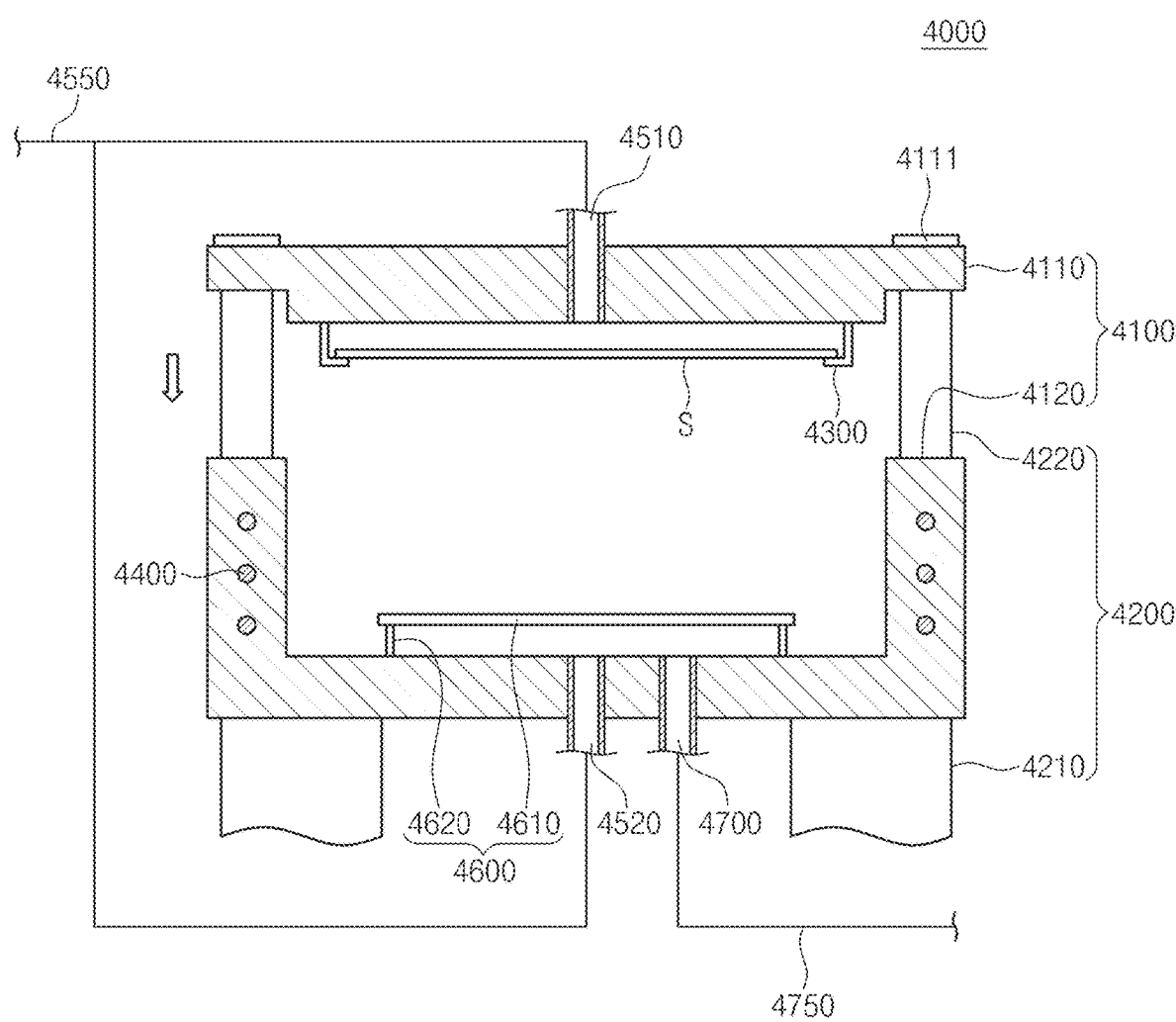

If the inside pressure of the second process chamber 4000 is sufficiently reduced to, for example, atmospheric pressure after the supercritical fluid is discharged, the housing 4100 is opened (S270). Referring to FIG. 16, the lift member 4200 lowers the lower housing 4120 to open the housing 4100.

In the case where the second process chamber 4000 has the slide structure with the horizontally slidable door 4130, the pressing member 4800 moves the door 4130 away from the opening of the housing 4100 to open the housing 4100. In the case where the second process chamber 4000 has the structure in which the door plate 4131 is moved by the door driving unit 4132, the door driving unit 4132 moves the door plate 4131 to open the housing 4100.

The substrate (S) is carried out of the second process chamber 4000 (S280). After the housing 4100 is opened, the transfer robot 2210 carries the substrate (S) out of the second process chamber 4000.

According to the present invention, the entirety of a substrate can be dried by injecting a supercritical fluid to the topside and rear side of the substrate.

In addition, according to the present invention, the shield plate prevents a supercritical fluid from being directly injected to a substrate so that the substrate may not be leaned.

The effects of the present invention are not limited to the above-mentioned effects. Other effects of the present invention will be apparently understood by those skilled in the art through the description and accompanying drawings.

The above-described embodiments are given so that those of skill in the related art could easily understand the present invention, and are not intended to limit the present invention.

Thus, the embodiments and elements thereof can be used in other ways or with known technology, and various modifications and changes in form and details can be made without departing from the scope of the present invention.

In addition, the scope of the present invention is defined by the following claims, and all differences within the scope will be considered as being included in the present invention.

What is claimed is:

1. A method for treating a substrate, the method comprising:
    supplying a supercritical process fluid to the substrate by injecting the supercritical process fluid through a first supply port of a housing in a bottom of the housing while a pressure in the housing is less than the critical pressure of the supercritical process fluid; and
    supplying the supercritical process fluid to the substrate by injecting the supercritical process fluid through a second supply port of the housing in other than the bottom of the housing after injecting the supercritical process fluid through the first supply port.

2. The method of claim 1, further comprising:
    preventing the supercritical process fluid from being directly injected onto the substrate.

3. The method of claim 2, wherein the preventing of the supercritical process fluid is performed using a shield plate between a support member on which the substrate is placed and the first supply port through which the supercritical process fluid is supplied.

4. The method of claim 3, wherein the supplying of the supercritical process fluid is performed by injecting the supercritical process fluid toward a topside of the substrate through the second supply port at an upper surface of the housing and injecting the supercritical process fluid toward a rear side of the substrate through the first supply port at a lower surface of the housing, and
    the preventing of the supercritical process fluid is performed using the shield plate between the first supply port and the support member so as to prevent the supercritical process fluid injected toward the rear side of the substrate from being directly injected to the substrate.

5. The method of claim 2, wherein the preventing the supercritical process fluid from being directly injected onto the substrate includes,
    preventing the supercritical process fluid from being directly injected onto a patterned side of the substrate.

6. The method of claim 1, wherein the supercritical process fluid dissolves an organic solvent remaining on the substrate.

7. The method of claim 1, further comprising:
carrying the substrate into the housing; and
carrying the substrate out of the housing,
wherein the housing comprises an upper housing and a lower housing under the upper housing,
the substrate is placed on a support member in a state where the upper housing and the lower housing are spaced apart from each other, and
after the substrate is carried into the housing, one of the upper housing and the lower housing is lifted or lowered to close the housing.

8. The method of claim 1, further comprising:
adjusting the pressure of the housing by heating the housing with a heating member.

9. The method of claim 1, further comprising:
exhausting liquefied supercritical fluid through an exhaust port on the housing.

10. The method of claim 1, wherein the critical pressure is 7.38 Mpa.

11. The method of claim 1, wherein the supercritical fluid is carbon dioxide.

12. The method of claim 1, further comprising:
controlling a phase of the supercritical fluid by adjusting a temperature and the pressure of the housing.

13. The method of claim 1, wherein the substrate is one of a silicon wafer, a glass substrate, or an organic substrate.

14. The method of claim 1, wherein a patterned side of the substrate faces a ceiling of the housing.

15. A method for treating a substrate, the method comprising:
carrying the substrate into a housing;
placing the substrate on a support member;
supplying a process fluid to the substrate;
preventing the process fluid from being directly injected to the substrate;
discharging the process fluid from the housing; and
carrying the substrate out of the housing,
wherein the preventing of the process fluid is performed using a shield plate between the support member and a supply port through which the process fluid is supplied,
wherein the supplying of the process fluid is performed by injecting the process fluid toward a topside of the substrate through a first supply port at an upper surface of the housing and injecting the process fluid toward a rear side of the substrate through a second supply port disposed at a lower surface of the housing, and
the preventing of the process fluid is performed using the shield plate between the second supply port and the support member so as to prevent the process fluid injected toward the rear side of the substrate from being directly injected to the substrate, and
wherein in the supplying of the process fluid, the process fluid is injected through the second supply port, and in response to an inside pressure of the housing reaching a preset value, the process fluid starts to be injected through the first supply port.

16. The method of claim 15, wherein the process fluid is a supercritical fluid, and the supercritical fluid dissolves an organic solvent remaining on the substrate.

17. The method of claim 15, further comprising:
closing the housing prior to providing the process fluid;
discharging the fluid; and
opening the housing after discharging the process fluid.

18. The method of claim 17, wherein the closing the housing includes,
horizontally moving a door to close the housing.

19. The method of claim 17, wherein the closing the housing includes,
vertically moving a lift rod to close the housing.

20. The method of claim 17, wherein the preventing the process fluid from being directly injected to the substrate includes,
preventing the process fluid from being directly injected onto a patterned side of the substrate.

* * * * *